(12) United States Patent
Lee et al.

(10) Patent No.: US 11,889,734 B2
(45) Date of Patent: Jan. 30, 2024

(54) INPUT SENSING CIRCUIT AND DISPLAY DEVICE INCLUDING THE SAME

(71) Applicant: SAMSUNG DISPLAY CO., LTD., Yongin-si (KR)

(72) Inventors: Sunhwa Lee, Yongin-si (KR); Mukyung Jeon, Ulsan (KR); Jaehyung Cho, Suwon-si (KR); Kihyun Pyo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/862,337

(22) Filed: Jul. 11, 2022

(65) Prior Publication Data

US 2022/0352257 A1 Nov. 3, 2022

Related U.S. Application Data

(63) Continuation of application No. 16/841,938, filed on Apr. 7, 2020, now Pat. No. 11,387,293.

(30) Foreign Application Priority Data

Apr. 29, 2019 (KR) .......................... 10-2019-0049615

(51) Int. Cl.
*H10K 59/40* (2023.01)
*G06F 3/041* (2006.01)
(Continued)

(52) U.S. Cl.
CPC ........... *H10K 59/40* (2023.02); *G06F 1/1652* (2013.01); *G06F 3/044* (2013.01); *G06F 3/0443* (2019.05);
(Continued)

(58) Field of Classification Search
CPC ............... H01L 27/323; H01L 27/3276; G06F 1/1652; G06F 3/04164; G06F 3/044;
(Continued)

(56) References Cited

U.S. PATENT DOCUMENTS

2014/0152910 A1* 6/2014 Kang .................... G06F 1/1652
349/12
2015/0362960 A1* 12/2015 Chang .................... G06F 1/1643
345/173

(Continued)

FOREIGN PATENT DOCUMENTS

CN 108874202 A 11/2018
KR 10-2015-0077831 A 7/2015
(Continued)

*Primary Examiner* — Douglas M Wilson
(74) *Attorney, Agent, or Firm* — Lewis Roca Rothgerber Christie LLP

(57) ABSTRACT

A display device includes a display panel and an input sensing circuit. The input sensing circuit includes a plurality of sensors and signal lines electrically connected to each of the plurality of sensors. Each of the plurality of signal lines includes a lower line and an upper line overlapping the lower line, and the lower line and the upper line are electrically connected in a plurality of contact areas. A long signal line among the plurality of signal lines has more contact areas than a short signal line.

17 Claims, 24 Drawing Sheets

(51) Int. Cl.
　　*G06F 3/044*　　(2006.01)
　　*H10K 59/131*　(2023.01)
　　*G06F 1/16*　　(2006.01)

(52) U.S. Cl.
　　CPC ....... *G06F 3/04164* (2019.05); *H10K 59/131* (2023.02); *G06F 1/1643* (2013.01); *G06F 3/041* (2013.01); *G06F 3/0412* (2013.01); *G06F 3/0416* (2013.01); *G06F 3/0446* (2019.05); *G06F 2203/04102* (2013.01); *G06F 2203/04111* (2013.01); *G06F 2203/04112* (2013.01)

(58) Field of Classification Search
　　CPC ...... G06F 3/0443; G06F 1/1643; G06F 3/041; G06F 3/0412; G06F 3/0416; G06F 3/0446; G06F 2203/04102; G06F 2203/04111; G06F 2203/04112
　　See application file for complete search history.

(56) References Cited

U.S. PATENT DOCUMENTS

| | | |
|---|---|---|
| 2016/0266691 A1 | 9/2016 | Jang et al. |
| 2018/0101270 A1 | 4/2018 | Cho et al. |
| 2018/0314372 A1* | 11/2018 | Lee ................ G06F 3/0412 |
| 2018/0366520 A1 | 12/2018 | Gwon et al. |
| 2021/0020703 A1* | 1/2021 | Oh ................ H10K 59/124 |
| 2021/0066401 A1* | 3/2021 | Won ............... H10K 59/131 |
| 2021/0193744 A1 | 6/2021 | Gwon et al. |
| 2022/0206641 A1* | 6/2022 | Kim ............... G01R 27/2605 |

FOREIGN PATENT DOCUMENTS

| | | |
|---|---|---|
| KR | 10-2016-0041541 A | 4/2016 |
| KR | 10-2017-0024288 A | 3/2017 |

\* cited by examiner

INPUT SENSING CIRCUIT AND DISPLAY DEVICE INCLUDING THE SAME

CROSS-REFERENCE TO RELATED APPLICATIONS

This application is a continuation of U.S. patent application Ser. No. 16/841,938, filed Apr. 7, 2020, which claims priority to and the benefit of Korean Patent Application No. 10-2019-0049615, filed Apr. 29, 2019, the entire content of both of which is incorporated herein by reference.

BACKGROUND

The present disclosure herein relates to an input sensing circuit and a display device including the same, and more particularly, to an input sensing circuit having excellent touch sensitivity and a display device including the same.

The display device displays various images on the display screen to provide information to the user. In related art, such display device typically displays information within the allocated screen.

Recently, a flexible display device including a flexible display panel that is capable of being bent is being developed. Unlike flat panel display devices, flexible display devices may be folded and/or rolled (e.g., like paper). The flexible display device in which the shape may be changed variously may be easily carried around regardless of the existing screen size, so that the user convenience is improved.

Also, recently, display devices that include an input sensing circuit capable of sensing a user's touch or a pressure applied by a user, as an input device, are being developed.

A display device may recognize a user's finger contacting a screen through an input sensing circuit. A touch sensing method in an input sensing circuit may include various suitable methods of input such as a resistance film input method, an optical input method, an electrostatic capacitance input method, and/or an ultrasonic input method. Among them, the electrostatic capacitance input method detects whether or not a touch occurs by using a capacitance that changes when a touch generating means (e.g., a user's finger) contacts the screen of a display device.

SUMMARY

One or more aspects of the present disclosure are directed toward ensuring that signal lines constituting an input sensing circuit have mutually uniform resistance values.

An embodiment of the inventive concept provides an input sensing circuit including: a plurality of first sensor groups extending in a first direction and including a plurality of first sensors; a plurality of second sensor groups extending in a second direction and including a plurality of second sensors, the second direction crossing the first direction; a first line and a second line respectively electrically connected to different first sensor groups among the plurality of first sensor groups; and a third line and a fourth line respectively electrically connected to different second sensor groups among the plurality of second sensor groups, wherein the first line includes: a first lower line having a first length; and a first upper line having a second length longer than the first length and being electrically connected to the first lower line in a plurality of first contact areas, wherein the second line includes: a second lower line having a third length shorter than the first length; and a second upper line having a fourth length longer than the third length and shorter than the second length and being electrically connected to the second lower line in a plurality of second contact areas, wherein the plurality of first contact areas is greater in number than the plurality of second contact areas.

In an embodiment, each of the plurality of first sensor groups may further include a plurality of first connection patterns that electrically connect two adjacent first sensors among the plurality of first sensors and are on the same layer as the plurality of first sensors, wherein each of the plurality of second sensor groups may further include a plurality of second connection patterns that electrically connect two adjacent second sensors among the plurality of second sensors and are on a different layer than the plurality of second sensors.

In an embodiment, the plurality of first sensors and the plurality of second sensors may be on the same layer.

In an embodiment, the first upper line and the second upper line may each be on the same layer as the plurality of first sensors, wherein the first lower line and the second lower line may each be on the same layer as the plurality of second connection patterns.

In an embodiment, at least a portion of the second lower line may be between the first lower line and the plurality of second connection patterns, wherein at least a portion of the second upper line may be between the first upper line and the plurality of first sensors.

In an embodiment, the first line may be electrically connected to an odd-numbered first sensor group among the plurality of first sensor groups, and the second line may be electrically connected to an even-numbered first sensor group among the plurality of first sensor groups.

In an embodiment, a plurality of opening parts may be defined in each of the plurality of first sensors and the plurality of second sensors.

In an embodiment, each of the plurality of first sensors and the plurality of second sensors may have a mesh shape.

In an embodiment, a difference between the first length and the second length may be less than a difference between the third length and the fourth length.

In an embodiment, the first lower line and the second lower line may not contact the plurality of first sensor groups and the plurality of second sensor groups.

In an embodiment of the inventive concept, a display device includes: a display panel including a light emitting element layer that includes a plurality of light emitting elements and a sealing layer that seals the plurality of light emitting elements; and an input sensing circuit on the display panel, wherein the input sensing circuit includes: a plurality of first sensor groups extending in a first direction and including a plurality of first sensors; a plurality of second sensor groups extending in a second direction and including a plurality of second sensors, the second direction crossing the first direction; a first line and a second line electrically connected to different first sensor groups, respectively, among the plurality of first sensor groups; and a third line and a fourth line electrically connected to different second sensor groups, respectively, among the plurality of second sensor groups, wherein the first line includes: a first lower line having a first length; and a first upper line having a second length longer than the first length and being electrically connected to the first lower line in a plurality of first contact areas, wherein the second line includes: a second lower line having a third length shorter than the first length; and a second upper line having a fourth length longer than the third length and shorter than the second length and being electrically connected to the second lower line in a plurality of second contact areas, wherein the plurality of first contact areas is greater in number than the plurality of second contact areas.

In an embodiment, each of the plurality of first sensor groups may further include a plurality of first connection patterns that electrically connect two adjacent first sensors among the plurality of first sensors and are on the same layer as the plurality of first sensors, wherein each of the plurality of second sensor groups may further include a plurality of second connection patterns that electrically connect two adjacent second sensors among the plurality of second sensors and are on a different layer than the plurality of second sensors.

In an embodiment, the plurality of first sensors and the plurality of second sensors may be on the same layer.

In an embodiment, the first upper line and the second upper line may each be on the same layer as the plurality of first sensors, wherein the first lower line and the second lower line may each be on the same layer as the plurality of second connection patterns.

In an embodiment, at least a portion of the second lower line may be between the first lower line and the plurality of second connection patterns, wherein at least a portion of the second upper line may be between the first upper line and the plurality of first sensors.

In an embodiment, a plurality of opening parts overlapping the plurality of light emitting elements may be defined in each of the plurality of first sensors and the plurality of second sensors.

In an embodiment, a difference between the first length and the second length may be less than a difference between the third length and the fourth length.

In an embodiment, the first lower line and the second lower line may not contact the plurality of first sensor groups and the plurality of second sensor groups.

In an embodiment of the inventive concept, an input sensing circuit includes: a base layer including a sensor area and a wiring area around the sensor area; a plurality of connection patterns on the sensor area; a plurality of lower lines on the wiring area and including a first lower line having a first length and a second lower line having a second length shorter than the first length; an insulation layer on the base layer, to cover the plurality of connection patterns and the plurality of lower lines, and to define a plurality of first contact holes exposing at least a portion of the first lower line and a plurality of second contact holes exposing at least a portion of the second lower line; a plurality of sensors on the insulation layer, overlapping the sensor area, and electrically connected to each other by the plurality of connection patterns; and a plurality of upper lines on the insulation layer and including a first upper line overlapping the first lower line and having a third length longer than the first length, and a second upper line overlapping the second lower line and having a fourth length longer than the second length and shorter than the third length, wherein the first lower line and the first upper line are electrically connected through the plurality of first contact holes and the second lower line and the second upper line are electrically connected through the plurality of second contact holes, wherein the plurality of first contact holes is greater in number than the plurality of second contact holes, and the plurality of sensors are electrically connected to the plurality of upper lines.

In an embodiment, at least a portion of the second lower line may be between the first lower line and the plurality of connection patterns, and at least a portion of the second upper line may be between the first upper line and the plurality of sensors.

In an embodiment, some upper lines among the plurality of upper lines may be adjacent a first side of the sensor area and remaining upper lines may be adjacent a second side of the sensor area, which is opposite to the first side.

In an embodiment, the plurality of sensors may be arranged in a matrix form, wherein the some upper lines may be electrically connected to sensors disposed in odd-numbered rows among the plurality of sensors, and the respective remaining upper lines may be electrically connected to sensors disposed in even-numbered rows among the plurality of sensors.

In an embodiment, a difference between the third length and the first length may be less than a difference between the fourth length and the second length.

In an embodiment, the input sensing circuit may further include: a plurality of pads electrically connected to a corresponding upper line among the plurality of upper lines; a printed circuit board electrically connected to the plurality of pads; and an input sensing driving unit on the printed circuit board, wherein the first upper line may be electrically connected to a first pad among the plurality of pads and the second upper line may be electrically connected to a second pad among the plurality of pads, wherein one end of the first lower line may be exposed by a first contact hole that is farthest from the first pad among the plurality of first contact holes, and one end of the second lower line may be exposed by a second contact hole that is farthest from the second pad among the plurality of second contact holes.

In an embodiment, the plurality of lower lines may not contact the plurality of sensors.

BRIEF DESCRIPTION OF THE FIGURES

The accompanying drawings are included to provide a further understanding of the inventive concept, and are incorporated in and constitute a part of this specification. The drawings illustrate example embodiments of the inventive concept and, together with the description, serve to explain principles of the inventive concept.

In the drawings.

DETAILED DESCRIPTION

Figure 1:
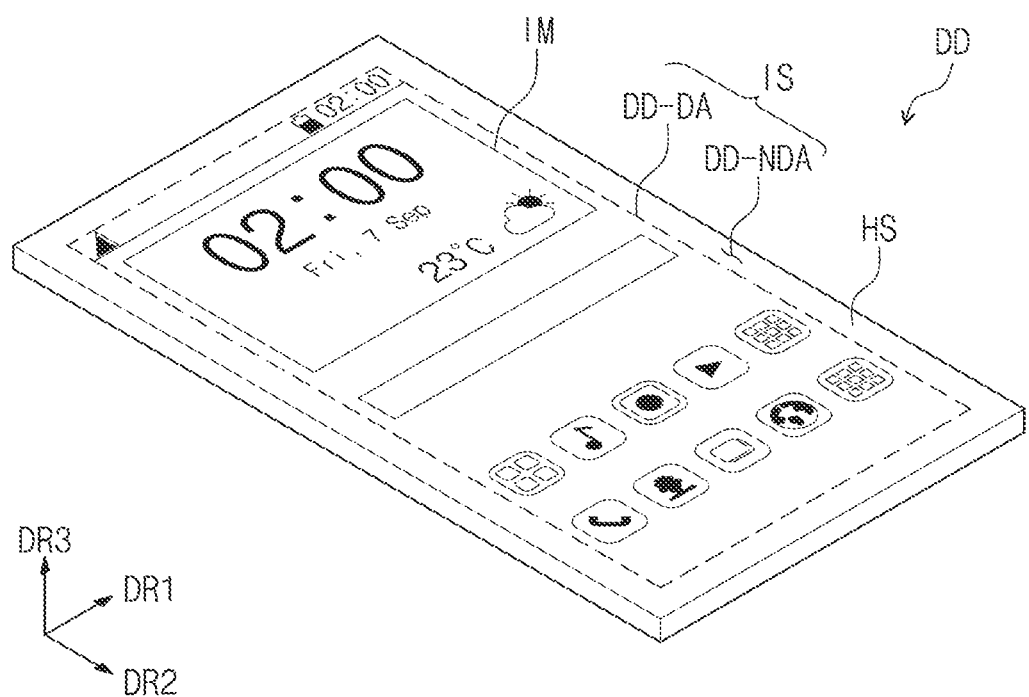
FIG. 1 is a perspective view of a display device according to an embodiment of the inventive concept.

Hereinafter, embodiments of the inventive concept will be described with reference to the drawings.

Additionally, in the drawings, the thicknesses, proportions, and dimensions of components may be exaggerated for effective description. "And/or" includes all of one or more combinations defined by related components. Expressions such as "at least one of," "one of," and "selected from," when preceding a list of elements, modify the entire list of elements and do not modify the individual elements of the list. Further, the use of "may" when describing embodiments of the present invention refers to "one or more embodiments of the present invention."

In various embodiments of the inventive concept, the terms "include," "comprise," "including," or "comprising," specify a property, a region, a fixed number, a step, a process, an element and/or a component but do not exclude other properties, regions, fixed numbers, steps, processes, elements and/or components.

Although the terms such as first and second are used to describe various components, these components should not be limited by these terms. The terms are only used to distinguish one component from other components. For example, a first component may be referred to as a second component, and similarly, a second component may be referred to as a first component without departing from the scope of the inventive concept. The expression of a singular form includes plural forms unless definitely indicating a particular case in terms of the context.

FIG. 1 is a perspective view of a display device DD according to an embodiment of the inventive concept. As shown in FIG. 1, the display surface IS where the image IM is displayed is parallel to (e.g., lies in) the plane defined by a first direction axis DR1 and a second direction axis DR2. A third direction axis DR3 indicates the normal (e.g., perpendicular) direction to the display surface IS, that is, a thickness direction of the display device DD. The front surface (or an upper surface) and the rear surface (or a lower surface) of each member are positioned along the third direction axis DR3. However, the directions that the first to third direction axes DR1, DR2, and DR3 indicate are relative and may be converted to other directions. Hereinafter, first to third directions refer to the same reference numerals of the respective directions that the first to third direction axes DR1, DR2, and DR3 indicate.

The display device DD according to an embodiment of the inventive concept may be a foldable display device. The display device DD may be used for small and medium-sized electronic devices such as mobile phones, tablets, car navigations, game consoles, and/or smart watches, in addition to large-sized electronic devices such as televisions and/or monitors.

As shown in FIG. 1, the display surface IS of the display device DD may include a plurality of areas. The display device DD may include a display area DD-DA where an image IM is displayed and a non-display area DD-NDA adjacent to the display area DD-DA. The non-display area DD-NDA is an area where no image is displayed. FIG. 1 shows application icons and a clock window as an example of the image IM. The display area DD-DA may have a rectangular form. The non-display area DD-NDA may surround the display area DD-DA. However, the inventive concept is not limited thereto, and a form of the display area DD-DA and a form of the non-display area DD-NDA may be designed relatively (e.g., may vary).

The display device DD may include a housing HS. The housing HS is disposed at the outer periphery of the display device DD and may accommodate the components therein.

FIGS. 2A to 2G illustrate how the display device DD shown in FIG. 1 may be folded, respectively.

Figure 2A:
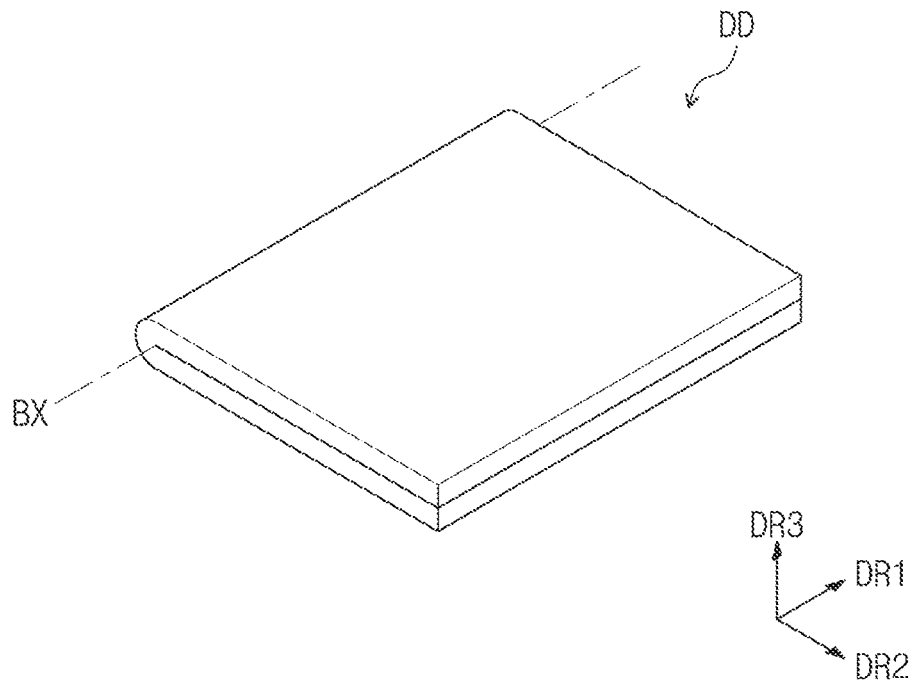
FIGS. 2A to 2G respectively illustrate a folded display device shown in FIG. 1 which is folded.
Figure 2B:
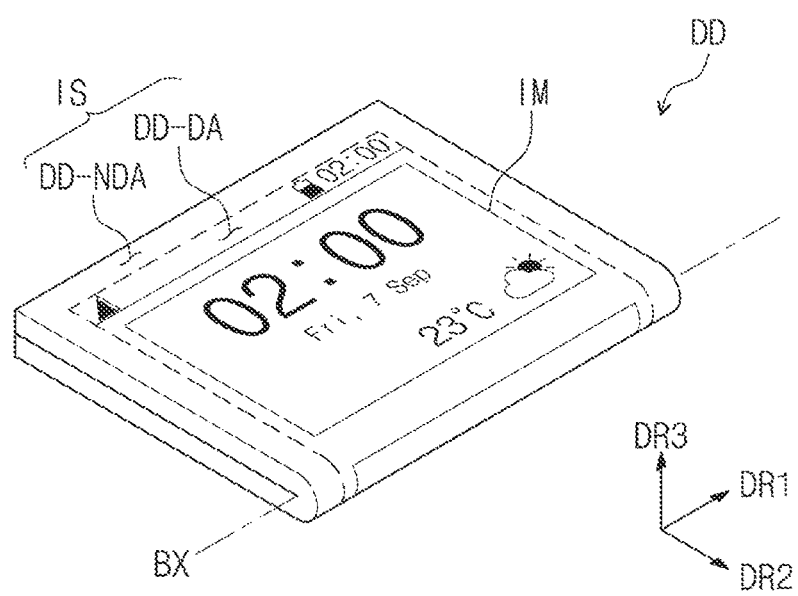
Figure 2C:
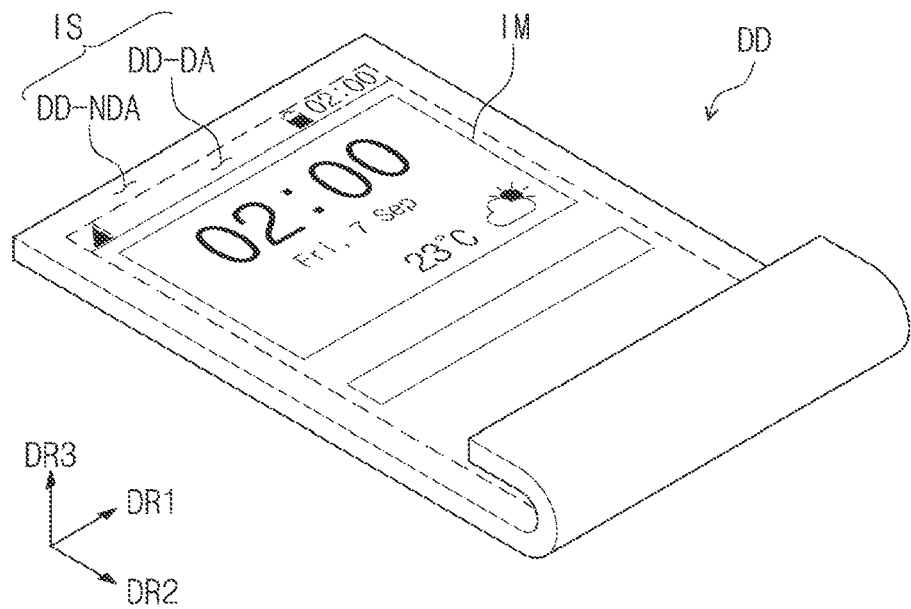
Figure 2D:
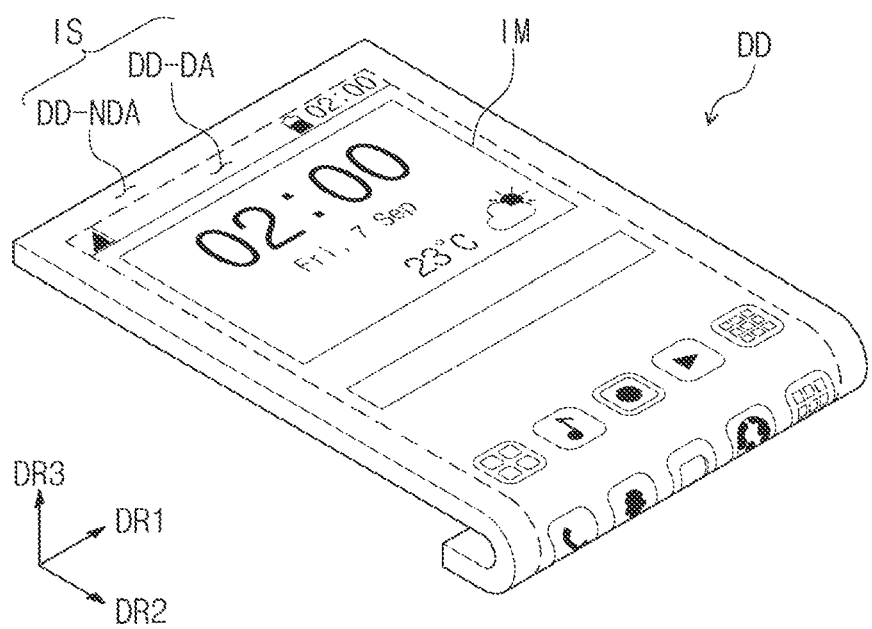
Figure 2E:
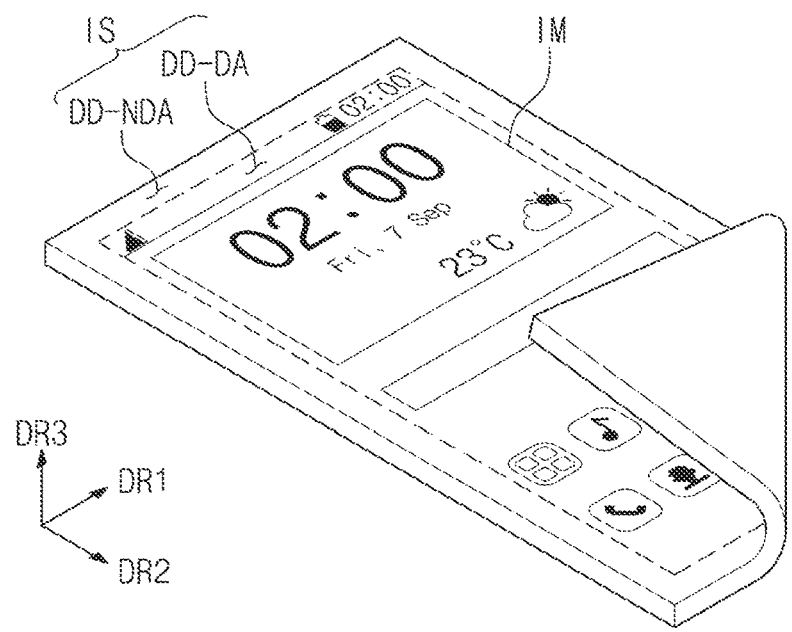

Referring to FIG. 2A, the display device DD according to an embodiment of the inventive concept may be in-folded (e.g., inward-folded) based on a bending axis BX parallel to a first direction DR1. Referring to FIG. 2B, the display device DD according to an embodiment of the inventive concept may be out-folded (e.g., outward-folded) based on the bending axis BX parallel to the first direction DR1. Referring to FIG. 2C, the display device DD according to an embodiment of the inventive concept may be folded inward from the end portion. Referring to FIG. 2D, the display device DD according to an embodiment of the inventive concept may be folded outward from the end portion. Referring to FIG. 2E, the display device DD according to an embodiment of the inventive concept may be folded in a diagonal direction.

Figure 2F:
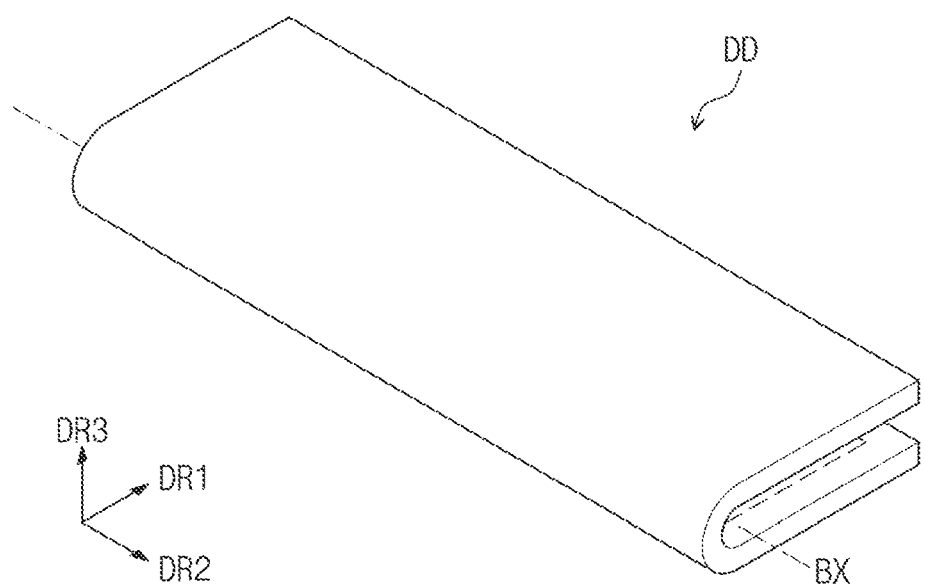
Figure 2G:
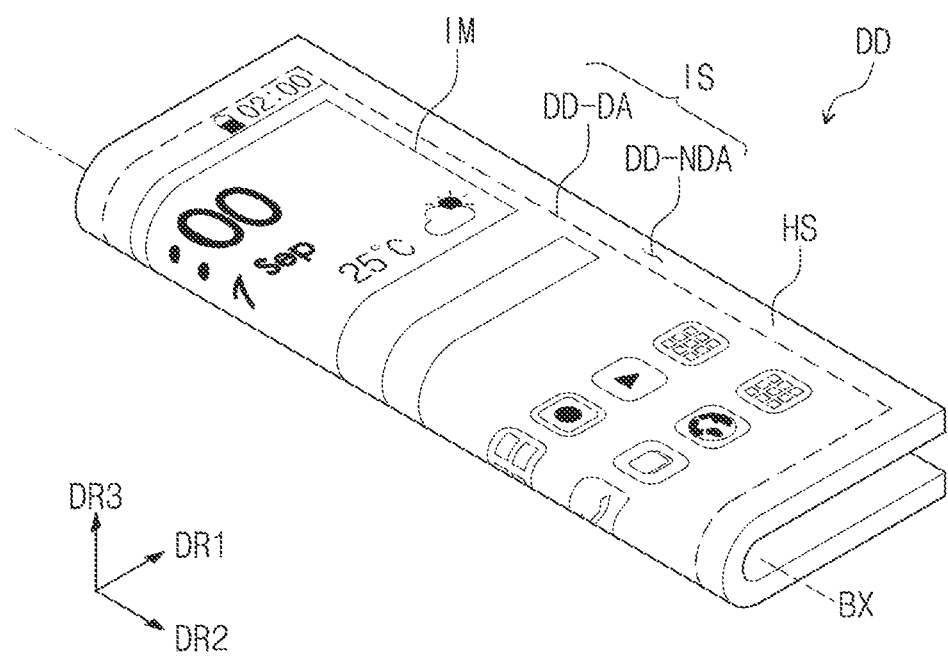

Referring to FIG. 2F, the display device DD according to an embodiment of the inventive concept may be in-folded based on the bending axis BX parallel to the second direction DR2. Referring to FIG. 2G, the display device DD according to an embodiment of the inventive concept may be out-folded based on the bending axis BX parallel to the second direction DR2.

Thus, the direction of the bending axis BX may be variously changed.

FIGS. 2A to 2G show examples of a folding method of the display device DD, but the inventive concept is not limited thereto.

Figure 3:
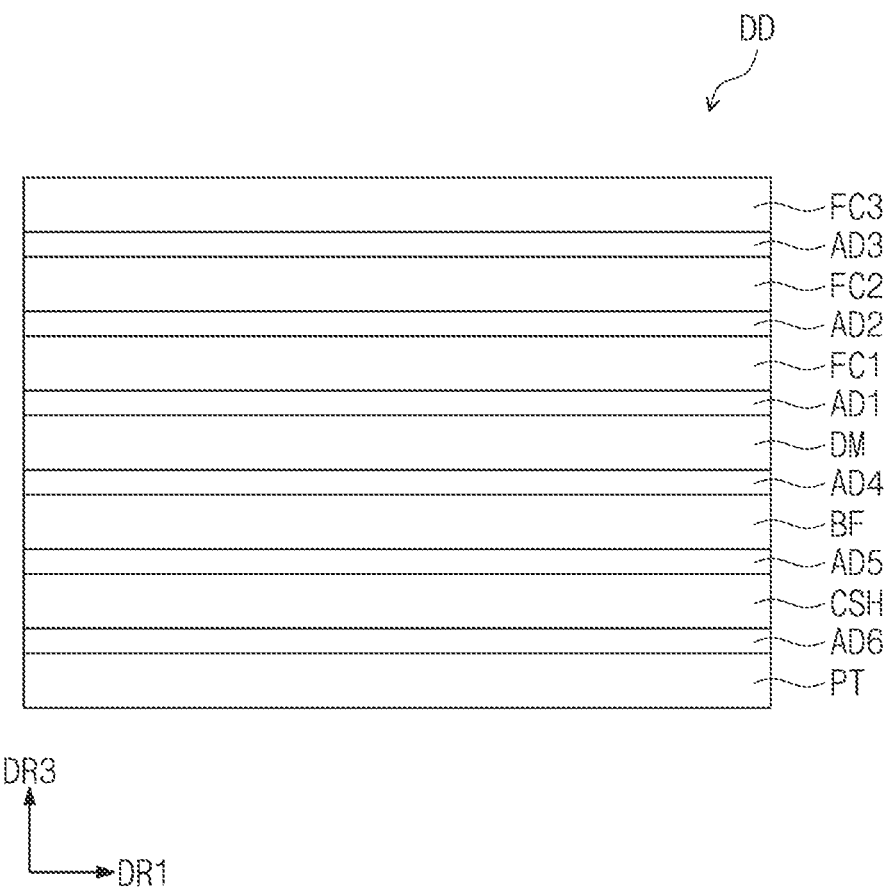
FIG. 3 is a cross-sectional view of a display device according to an embodiment of the inventive concept.
Figure 4A:
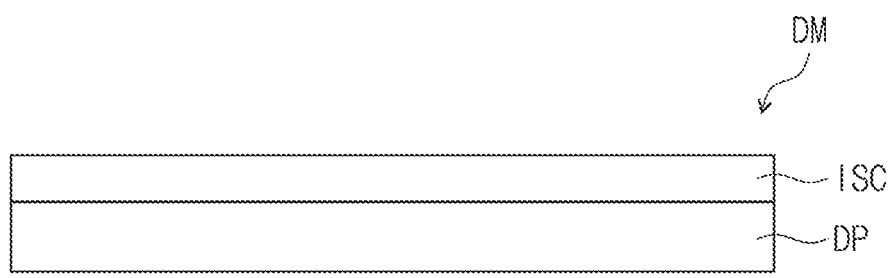
FIGS. 4A and 4B are cross-sectional views of a display module shown in FIG. 3.
Figure 4B:
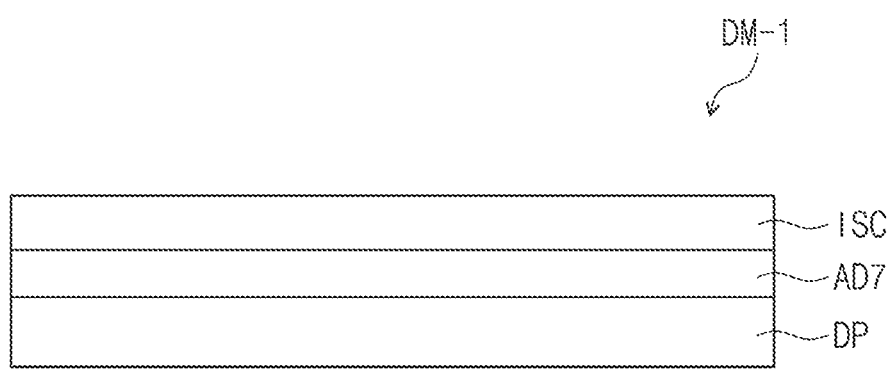

FIG. 3 is a cross-sectional view of a display device DD according to an embodiment of the inventive concept. FIGS. 4A and 4B are cross-sectional views of the display modules DM and DM-1 shown in FIG. 3. FIG. 3 shows a cross-section that a first direction axis DR1 and a third direction axis DR3 define.

The display device DD includes a display module DM, a plurality of functional layers FC1 to FC3, a base film BF, an impact absorbing member CSH, a support member PT, and a plurality of adhesive members AD1 to AD6. In one or more embodiments of the inventive concept, some of the components of the display device DD may be omitted as needed.

In one or more embodiments of the inventive concept, each of the adhesive members AD1 to AD6 may be a pressure sensitive adhesive (PSA).

The functional layers FC1 to FC3 may be disposed on the upper part of the display module DM.

The first functional layer FC1 may be bonded to the display module DM by the first adhesive member AD1. The second functional layer FC2 may be bonded to the first functional layer FC1 by the second adhesive member AD2. The third functional layer FC3 may be bonded to the second functional layer FC2 by the third adhesive member AD3.

Each of the first through third functional layers FC1 to FC3 may include a polymeric material and/or glass. Each of the first through third functional layers FC1 to FC3 may be in a film form.

The thickness of the first through third functional layers FC1 to FC3 may each independently be 35 μm or more and 60 μm or less. If the thickness of each of the first through third functional layers FC1 to FC3 is smaller than 35 μm, the performance of the intended function is deteriorated. If it is larger than 60 μm, the flexibility of the display device DD may be reduced. In one or more embodiments of the inventive concept, the first functional layer FC1 may be a polarizing functional layer that polarizes incident light. The second functional layer FC2 may be an impact absorbing functional layer that absorbs impact applied from the outside. The third functional layer FC3 may be a window functional layer constituting the outer surface of the display device DD. In one or more embodiments of the inventive concept, some of the first to third functional layers FC1 to FC3 may be omitted.

The base film BF, the impact absorbing member CSH, and the support member PT are disposed at the lower part of the display module DM.

The base film BF may be bonded to the display module DM by the fourth adhesive member AD4. The base film BF may include a polymer material.

The impact absorbing member CSH may be bonded to the base film BF by the fifth adhesive member AD5. The impact absorbing member CSH may include a polymeric material. The impact absorbing member CSH may be a layer for absorbing an externally applied impact.

The support member PT may be bonded to the impact absorbing member CSH by the sixth adhesive member AD6. The support member PT may support the display module DM. The support member PT may include a hinge for folding or bending the display module DM. The support member PT may have a rigid property.

Referring to FIG. 4A, the display module DM may include a display panel DP and an input sensing circuit ISC. The input sensing circuit ISC is capable of sensing externally applied touch and/or pressure.

The input sensing circuit ISC may be disposed directly on a thin film sealing layer TFE (see FIG. 5) of the display panel DP. Here, the direct placement means that the input sensing circuit ISC is disposed on the display panel DP without a separate adhesive member.

Referring to FIG. 4B, the display module DM-1 may include a display panel DP, an input sensing circuit ISC, and a seventh adhesive member AD7. The display panel DP and the input sensing circuit ISC may be bonded to each other by the seventh adhesive member AD7.

Figure 5:
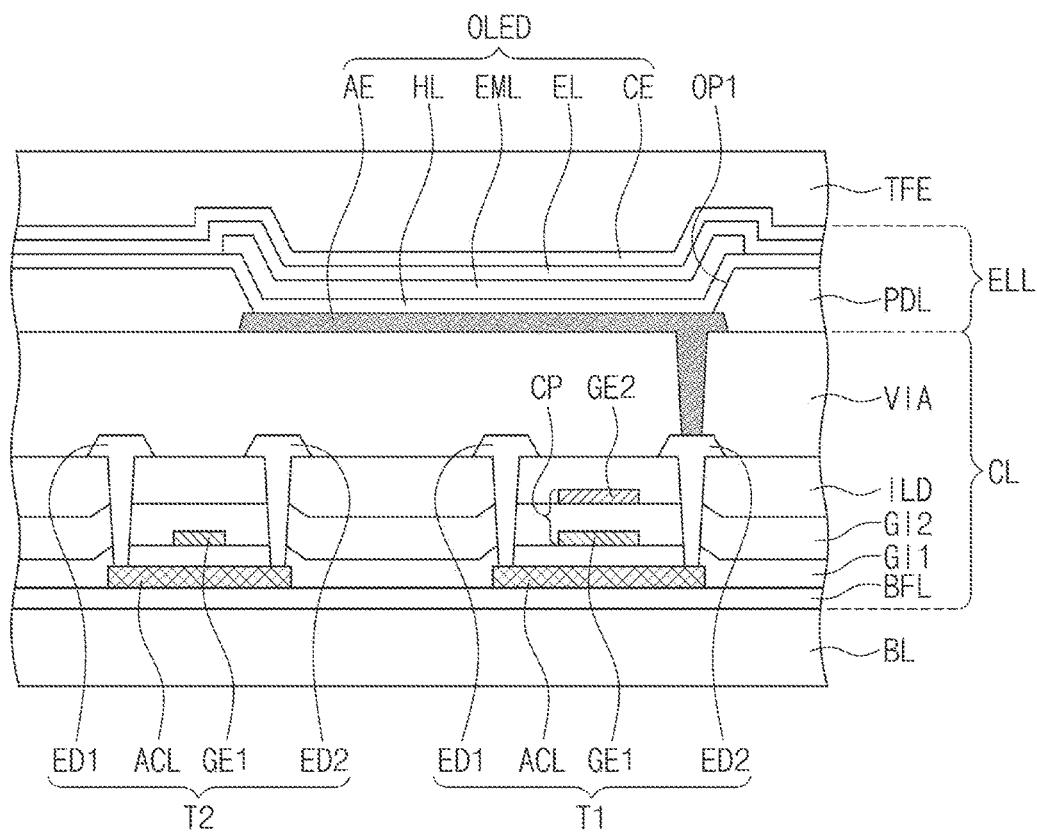
FIG. 5 shows a cross section of a part of a display panel according to an embodiment of the inventive concept.

FIG. 5 shows a cross section of a part of a display panel DP according to one or more embodiments of the inventive concept.

The display panel DP (see e.g., FIGS. 4A and 4B) may include a base layer BL, a circuit layer CL, a light emitting element layer ELL, and a thin film sealing layer TFE.

The circuit layer CL may include a buffer layer BFL, gate insulation layers GI1 and GI2, an interlayer insulation layer ILD, a circuit insulation layer VIA, and transistors T1 and T2. Each of the buffer layer BFL, the gate insulation layers GI1 and GI2, the interlayer insulation layer ILD, and the circuit insulation layer VIA may include an organic material and/or an inorganic material. An effective portion ACL, constituting pixels, of the transistors T1 and T2 may be disposed on the buffer layer BFL. The first gate insulation layer GI1 may be disposed on the buffer layer BFL to cover the effective portion ACL. The transistors T1 and T2 may include a control electrode GE1 disposed on the first gate insulation layer GI1. The control electrode GE1 of the first transistor T1 may be one of two electrodes constituting the capacitor CP. The second gate insulation layer GI2 may be disposed on the first gate insulation layer GI1 to cover the control electrode GE1. An electrode GE2 serving as the other of the two electrodes constituting the capacitor CP may be provided on the second gate insulation layer GI2. The interlayer insulation layer ILD may be disposed on the second gate insulation layer GI2 to cover the electrode GE2. The first electrode ED1 and the second electrode ED2 may be connected to corresponding portions of the effective portion ACL through a contact hole formed to penetrate the gate insulation layers GI1 and GI2 and the interlayer insulation layer ILD. The circuit insulation layer VIA may be disposed on the interlayer insulation layer ILD to cover the first electrode ED1 and the second electrode ED2. The circuit insulation layer VIA can provide a flat surface.

The light emitting element layer ELL may include an organic light emitting element OLED and a pixel defining layer PDL. The organic light emitting element OLED may include an anode electrode AE, a hole control layer HL, a light emitting layer EML, an electron control layer EL, and a cathode electrode CE. The anode electrode AE of the organic light emitting element OLED may be connected to the second electrode ED2 through a contact hole formed to penetrate the circuit insulation layer VIA.

The first opening part OP1 defined in the pixel defining layer PDL may expose the anode electrode AE of the organic light emitting element OLED.

The thin film sealing layer TFE seals the light emitting element layer ELL, so that the light emitting element layer ELL may be protected from external oxygen and/or moisture. The thin film sealing layer TFE may be a layer in which an organic film and an inorganic film are mixed.

In this specification, an area where light generated by the organic light emitting element OLED is emitted to the outside of the display area DD-DA may be defined as a pixel area, and an area other than the pixel area may be defined as a non-pixel area.

Although the organic light emitting element OLED is illustrated as an example in FIG. 5, in another embodiment of the inventive concept, the organic light emitting element OLED may be replaced by a micro LED, and the laminated structure of the display panel DP may be changed accordingly.

Figure 6:
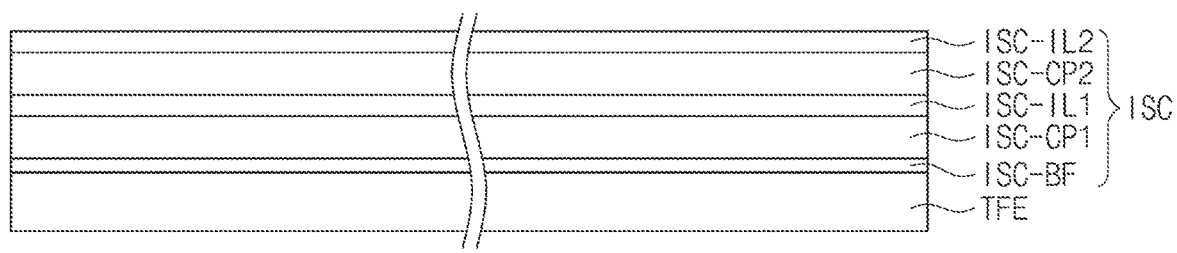
FIG. 6 is a cross-sectional view of an input sensing circuit according to an embodiment of the inventive concept.
Figure 6:
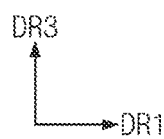

FIG. 6 is a cross-sectional view of an input sensing circuit ISC according to one or more embodiments of the inventive concept.

As shown in FIG. 6, the input sensing circuit ISC includes a silicon-buffer layer ISC-BF, a first conductive pattern ISC-CP1, a first insulation layer ISC-IL1, a second conductive pattern ISC-CP2, and a second insulation layer ISC-IL2.

Figure 12A:
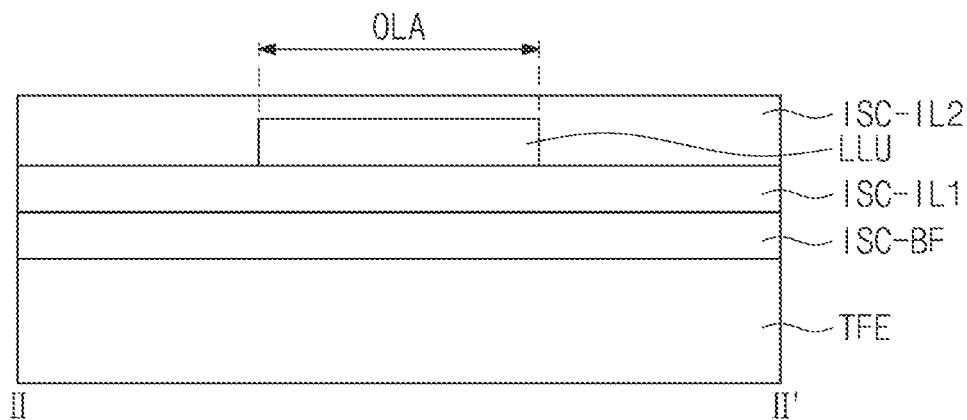
FIG. 12A is a cross section taken along the line II-II' of FIG. 11 by way of example.
Figure 12B:
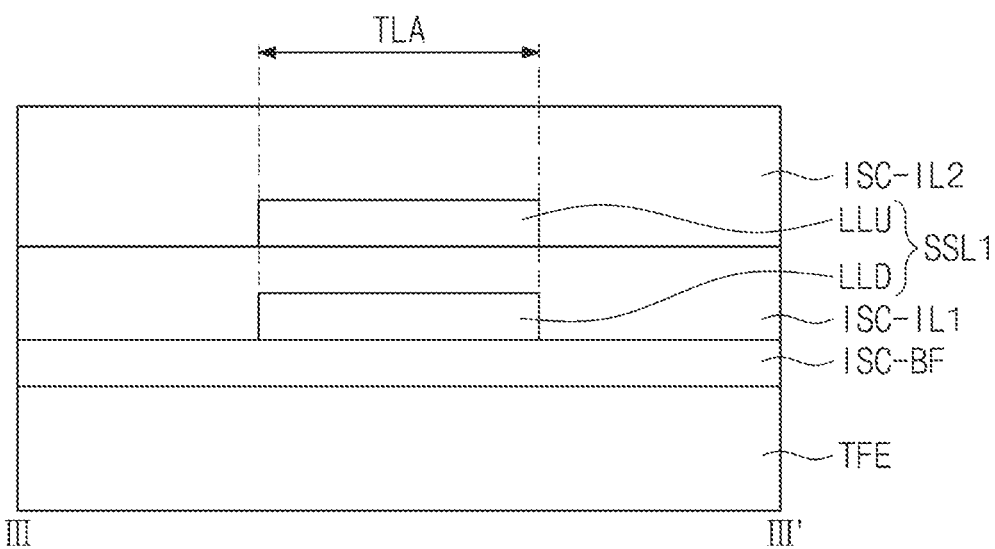
FIG. 12B is a cross section taken along the line III-III' of FIG. 11 by way of example.

The first conductive pattern ISC-CP1 may include a second connection pattern CNP2 (see FIG. 9A) and a lower line LLD (see FIG. 12B). The second conductive pattern ISC-CP2 may include first sensors IE1-1 and IE1-2 (see FIG. 9C), second sensors IE2-1 and IE2-2, (see FIG. 9C), a first connection pattern CNP1 (see FIG. 9C), and an upper line LLU (see FIG. 12B).

The silicon-buffer layer ISC-BF may include silicon nitride (SiNx).

In one or more embodiments of the inventive concept, the silicon-buffer layer ISC-BF may be omitted. In this case, the first conductive pattern ISC-CP1 may be disposed directly on the thin film sealing layer TFE. That is, the first conductive pattern ISC-CP1 may contact the thin film sealing layer TFE.

At least a portion of the second conductive pattern ISC-CP2 may insulatingly intersect or cross the first conductive pattern ISC-CP1 with the first insulation layer ISC-IL1 therebetween. Another portion of the second conductive pattern ISC-CP2 may be electrically connected to the first conductive pattern ISC-CP1 through the contact holes defined in the first insulation layer ISC-IL1.

Each of the first conductive pattern ISC-CP1 and the second conductive pattern ISC-CP2 may have a single-layer structure or may have a multilayer structure stacked along the third directional axis DR3.

Each of the first insulation layer ISC-IL1 and the second insulation layer ISC-IL2 may include an organic material and/or an inorganic material.

In one or more embodiments of the inventive concept, the first insulation layer ISC-IL1 may cover the entire thin film sealing layer TFE or may include a plurality of insulation patterns.

Figure 7:
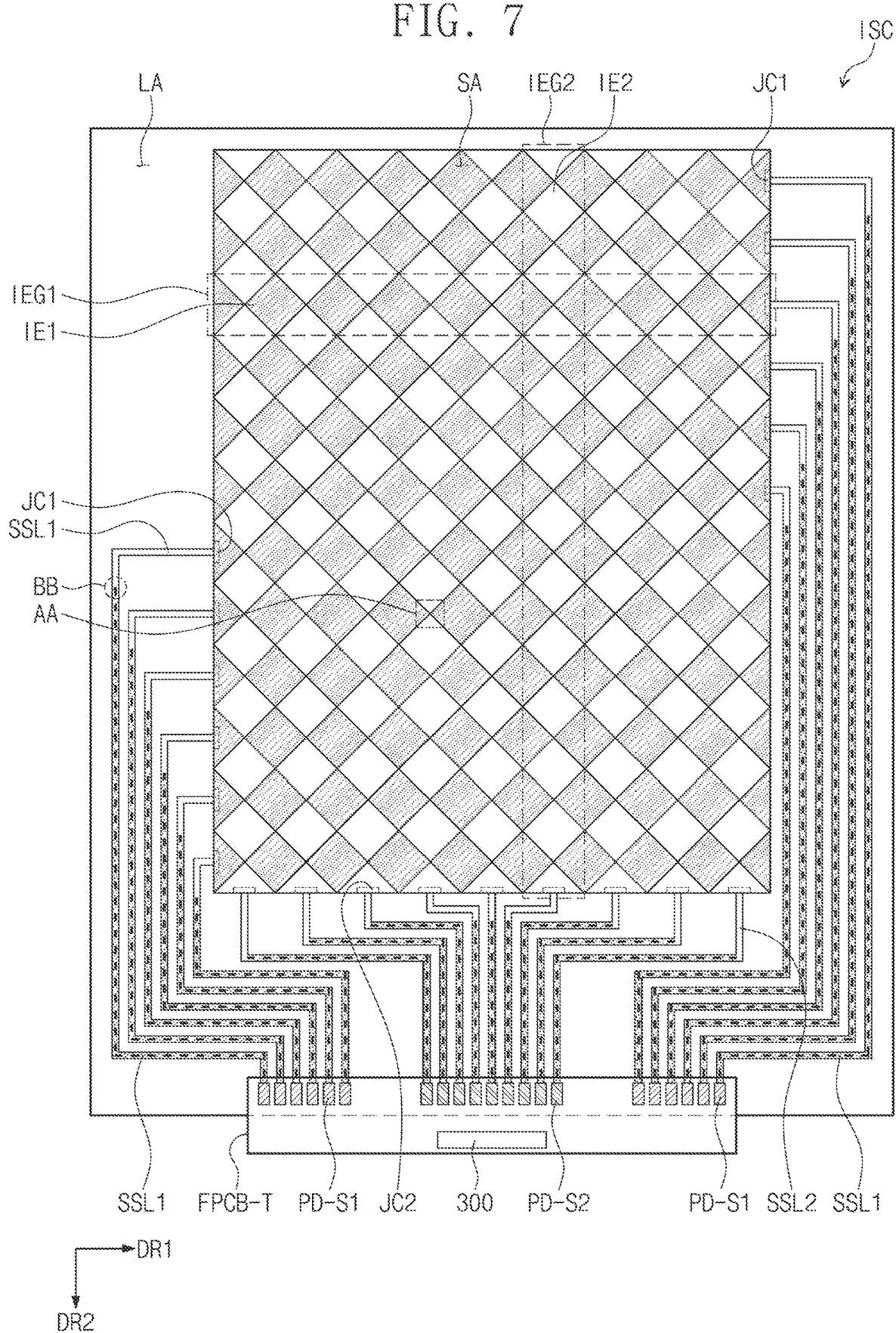
FIG. 7 is a plan view of an input sensing circuit according to an embodiment of the inventive concept.

FIG. 7 is a plan view of an input sensing circuit ISC according to one or more embodiments of the inventive concept.

A sensor area SA that may sense external input and a wiring area LA that surrounds the sensor area SA may be defined in the input sensing circuit ISC.

The input sensing circuit ISC includes first sensor groups IEG1, second sensor groups IEG2, first signal lines SSL1, second signal lines SSL2, signal pads PD-S1 and PD-S2, a printed circuit board FPCB-T, and an input sensing driving unit 300.

Each of the first sensor groups IEG1 may extend in a first direction DR1 and the first sensor groups IEG1 may be arranged in a second direction DR2. Each of the first sensor groups IEG1 may include a plurality of first sensor patterns IE1 (hereinafter referred to as a first sensor) and a plurality of first connection patterns CNP1. For example, the first sensor IE1 may be an Rx sensor. The first sensors IE1 may be arranged in a matrix form.

Each of the second sensor groups IEG2 may extend in a second direction DR2, and the second sensor groups IEG2 may be arranged in a first direction DR1. Each of the second sensor groups IEG2 may include a plurality of second sensor patterns IE2 (hereinafter referred to as a second sensor) and a plurality of second connection patterns CNP2. For example, the second sensor IE2 may be a Tx sensor. The second sensors IE2 may be arranged in a matrix form.

In one or more embodiments of the inventive concept, the length of the first sensor group IEG1 measured in the first direction DR1 may be shorter than the length of the second sensor group IEG2 measured in the second direction DR2. However, the inventive concept is not limited thereto.

In one or more embodiments of the inventive concept, each of the first sensors IE1 may be electrostatically coupled to adjacent second sensors IE2 among the second sensors IE2 to form an electrostatic capacity. In one or more embodiments of the inventive concept, each of the first sensors IE1 and second sensors IE2 may be electrostatically coupled to an external object (e.g., a human finger) to form an electrostatic capacity.

In one or more embodiments of the inventive concept, the input sensing circuit ISC may sense a change in electrostatic capacity formed between the first sensors IE1 and the second sensors IE2 and determine whether or not the input is applied from the outside. In one or more embodiments of the inventive concept, the input sensing circuit ISC may sense a change in electrostatic capacity formed between the first sensors IE1 and the second sensors IE2 and an external object and determine whether or not the input is applied from the outside.

The first signal lines SSL1, the second signal lines SSL2, the first signal pads PD-S1 and the second signal pads PD-S2 may be arranged in the wiring area LA.

Some of the first signal lines SSL1 may be disposed adjacent to the first side of the sensor area SA and the remainder may be disposed adjacent to the second side facing the first side of the sensor area SA. For example, some of the first signal lines SSL1 may be disposed on the left side of the sensor area SA, and the remainder may be disposed on the right side of the sensor area SA.

Each of the first signal lines SSL1 may include a first junction part JC1 and each of the second signal lines SSL2 may include a second junction part JC2.

The first signal lines SSL1 may be electrically connected to the first sensor groups IEG1 through the first junction parts JC1, respectively. For example, the first junction parts JC1 and the first sensors IE1 may overlap to be electrically connected to each other on a plane.

In one or more embodiments of the inventive concept, the first signal lines SSL1 may be connected to the first sensor groups IEG1 in a single routing structure. Single routing as used herein means that the first signal lines SSL1 and the first sensor groups IEG1 are connected one-to-one. However, the connection relationship between the first signal lines SSL1 and the first sensor groups IEG1 is not limited thereto. The second signal lines SSL2 may be electrically connected to the second sensor groups IEG2 through the second junction parts JC2, respectively. For example, the second junction parts JC2 and the second sensors IE2 may overlap to be electrically connected to each other on a plane.

In one or more embodiments of the inventive concept, the second signal lines SSL2 may be connected to the second sensor groups IEG2 in a single routing structure. However, the inventive concept is not limited thereto. In some embodiments of the inventive concept, the second signal lines SSL2 may be connected to the second sensor groups IEG2 in a double routing structure. The double routing may mean that two second signal lines SSL2 are connected to one second sensor group IEG2.

In this specification, the first signal lines SSL1 shall be understood as including a first line and a second line, and the second signal lines SSL2 shall be understood as including a third line and a fourth line.

In FIG. 7, it is exemplarily (as an example) shown that each of the first sensor groups IEG1 disposed on the upper part of the sensor area SA is electrically connected to the first signal lines SSL1 disposed on the right side of the sensor area SA, and each of the first sensor groups IEG1 disposed on the lower part of the sensor area SA is electrically connected to the first signal lines SSL1 disposed on the left side of the sensor area SA, but the inventive concept is not limited thereto.

The first signal pads PD-S1 may be connected to the first signal lines SSL1. The second signal pads PD-S2 may be connected to the second signal lines SSL2.

The printed circuit board FPCB-T may be electrically connected to the signal pads PD-S1 and PD-S2.

The input sensing driving unit 300 may be mounted on a printed circuit board FPCB-T. The input sensing driving unit 300 may transmit/receive and/or calculate an electrical signal to determine whether a user's touch occurs and whether or not the pressure is applied in the sensor area SA.

Figure 8:
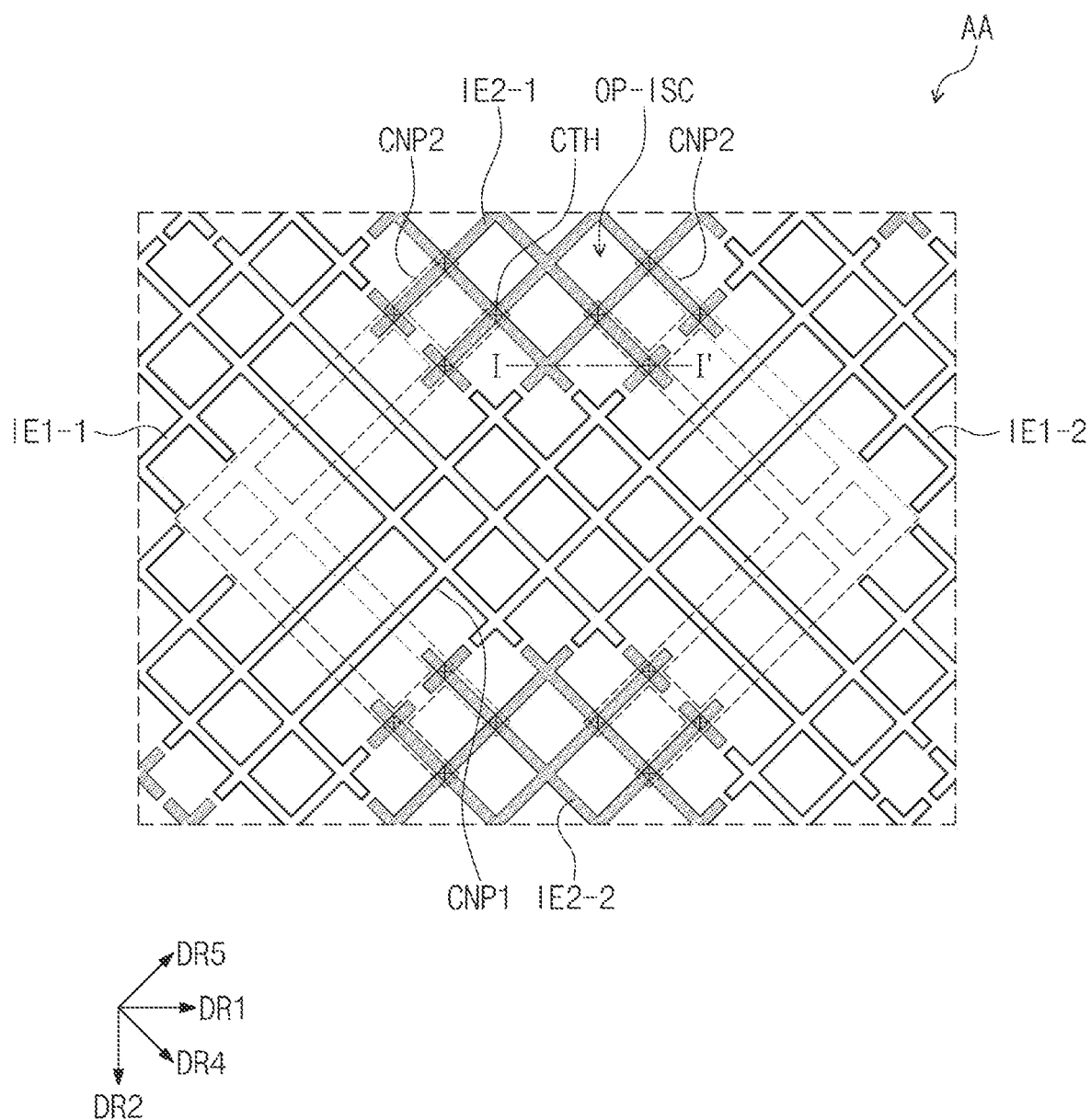
FIG. 8 is an enlarged view of area AA in FIG. 7.
Figure 9A:
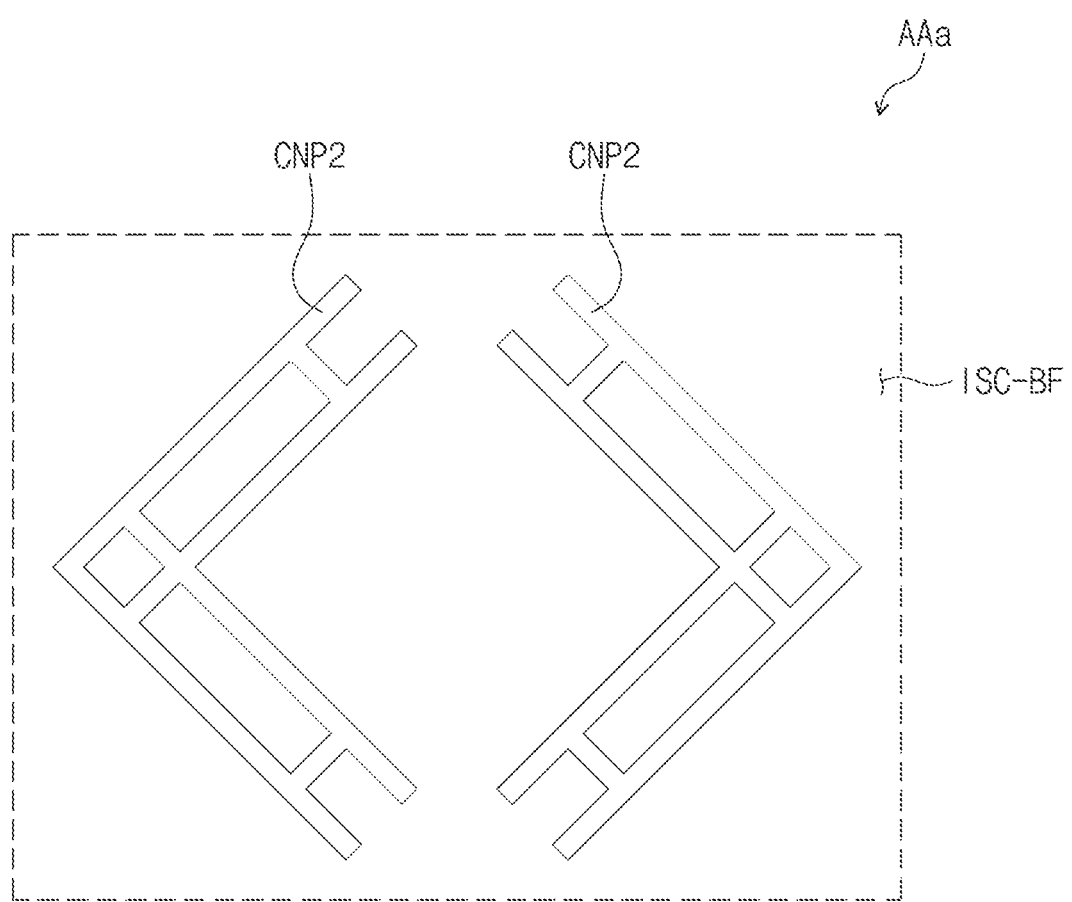
FIGS. 9A, 9B, and 9C show area AA of FIG. 7 by each layer.
Figure 9B:
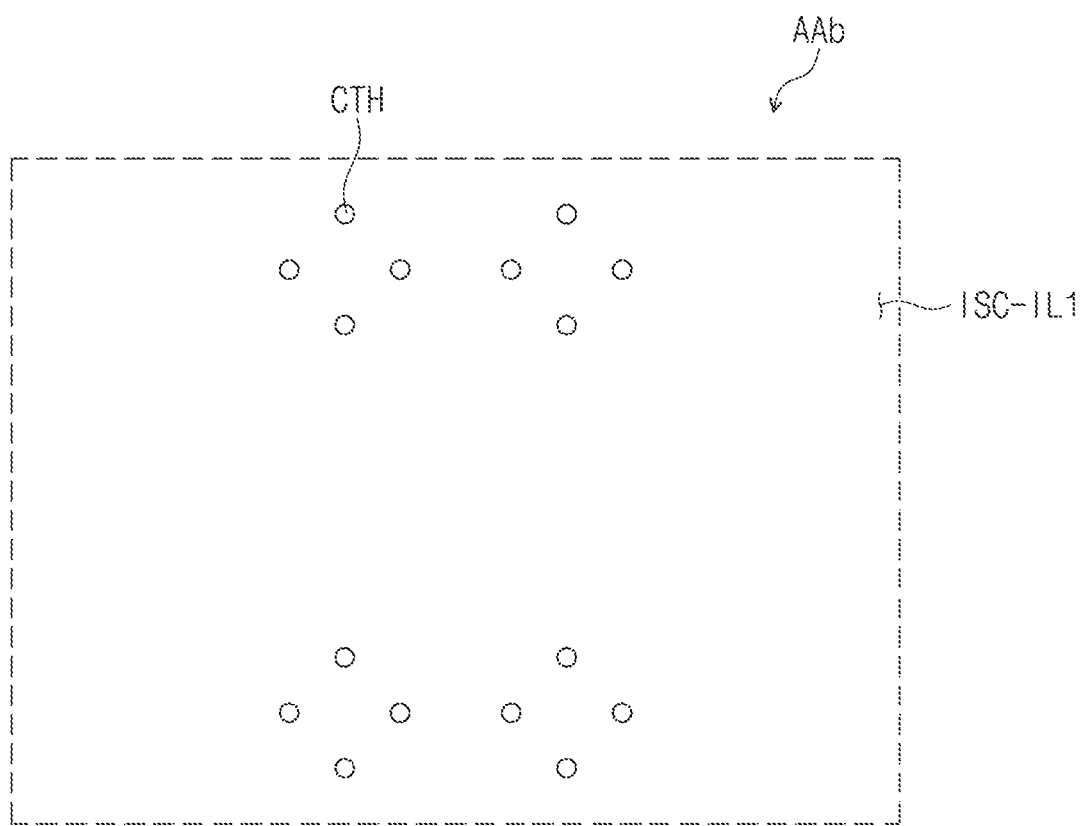
Figure 9C:
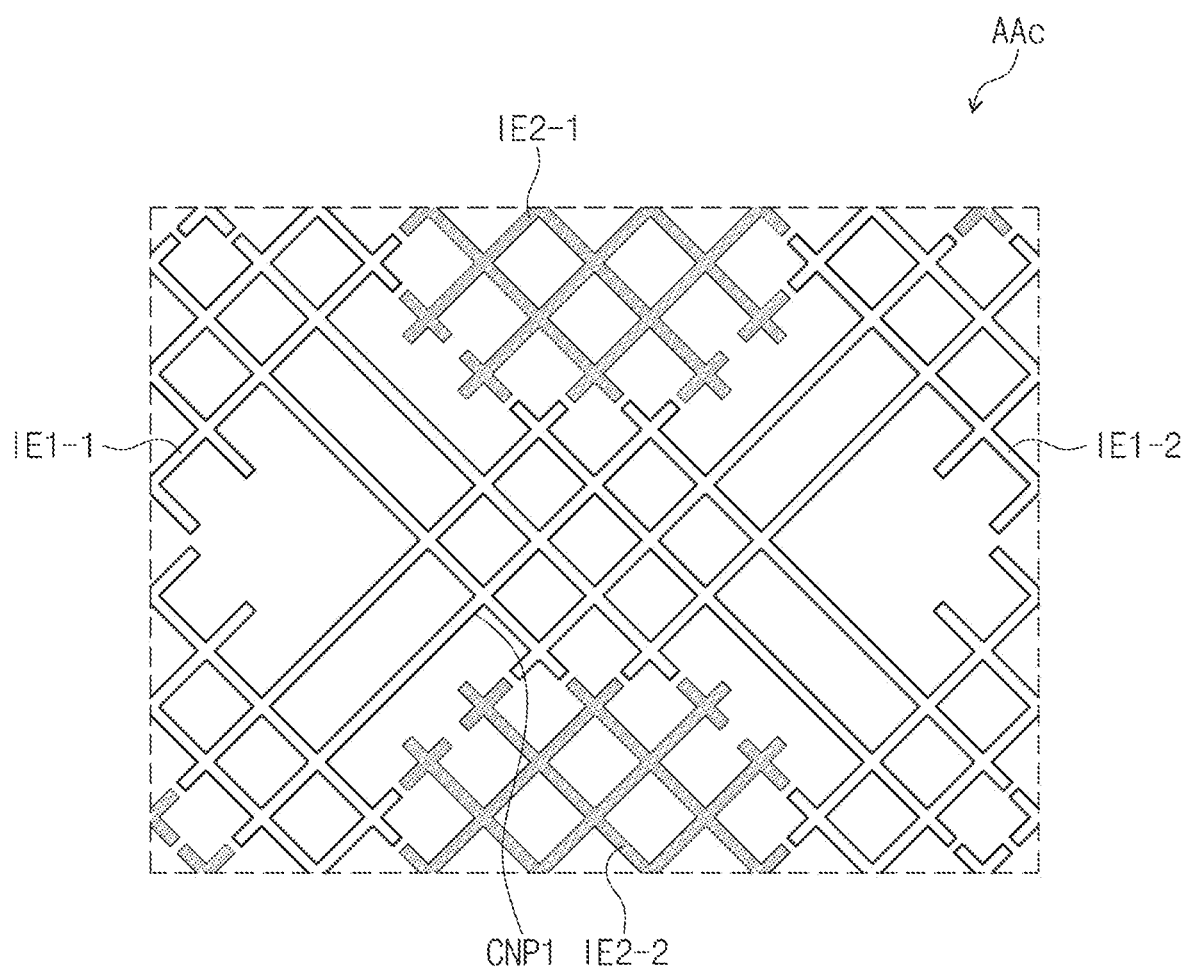

FIG. 8 is an enlarged view of area AA in FIG. 7. FIGS. 9A, 9B, and 9C show area AA of FIG. 7 by each layer.

Area AAa in FIG. 9A shows a portion corresponding to the area AA of the first conductive pattern ISC-CP1. Area AAb in FIG. 9B shows a portion corresponding to the area AA of the first insulation layer ISC-IL1. Area AAc in FIG. 9C shows a portion corresponding to the area AA of the second conductive pattern ISC-CP2.

Referring to FIG. 9A, a second connection pattern CNP2 may be disposed on the silicon-buffer layer ISC-BF.

The second connection pattern CNP2 is a pattern for connecting two adjacent ones among the second sensors IE2 (see FIG. 7).

Referring to FIG. 9B, a plurality of contact holes CTH may be defined in the first insulation layer ISC-IL1. The contact holes CTH may expose a portion of the second connection pattern CNP2. For example, the contact holes CTH may expose both ends of the second connection pattern CNP2.

Although FIG. 9B exemplarily shows 16 contact holes CTH, the inventive concept is not limited thereto, and the number of contact holes CTH may be changed as needed.

Referring to FIGS. 6 and 9C, the first sensors IE1-1 and IE1-2, the second sensors IE2-1 and IE2-2 and the first connection pattern CNP1 are disposed on the first insulation layer ISC-IL1.

The left first sensor IE1-1 and the right first sensor IE1-2 may be electrically connected by the first connection pattern CNP1.

The upper second sensor IE2-1 and the lower second sensor IE2-2 may be electrically connected to the second connection pattern CNP2 through the contact holes CTH of the first insulation layer ISC-IL1. That is, the upper second sensor IE2-1 and the lower second sensor IE2-2 may be electrically connected by the second connection pattern CNP2.

The first connection pattern CNP1 may be disposed between the upper second sensor IE2-1 and the lower second sensor IE2-2. The first connection pattern CNP1 may be isolated from the upper second sensor IE2-1 and the lower second sensor IE2-2.

Referring to FIG. 8, a direction between the first direction DR1 and the second direction DR2 may be defined as a fourth direction DR4. The fifth direction DR5 may be defined as a direction orthogonal to the fourth direction DR4. For example, the fourth direction DR4 may form 45 degrees with respect to the first direction DR1 and the second direction DR2, respectively. The fifth direction DR5 may form 45 degrees with respect to the first direction DR1 and may form 135 degrees with respect to the second direction DR2.

Within area AA, the wirings constituting the first conductive pattern ISC-CP1 and the second conductive pattern ISC-CP2 may extend in the direction parallel to the fourth direction DR4 or the fifth direction DR5.

Within area AA, a plurality of touch-opening parts OP-ISC may be defined between the wirings constituting the first conductive pattern ISC-CP1 and the second conductive pattern ISC-CP2. Within area AA, each of the first conductive pattern ISC-CP1 and the second conductive pattern ISC-CP2 may have a mesh shape. In one embodiment of the inventive concept, the touch-opening parts OP-ISC may correspond to organic light emitting elements OLED (see FIG. 5), respectively.

Each of the touch-opening parts OP-ISC may pass light generated by the organic light emitting element OLED (see FIG. 5). That is, the touch-opening part OP-ISC may overlap the anode electrode AE of the organic light emitting element OLED (see FIG. 5). Accordingly, the light generated from the organic light emitting element OLED (see FIG. 5) may be emitted to the outside through the touch-opening part OP-ISC.

Figure 10:
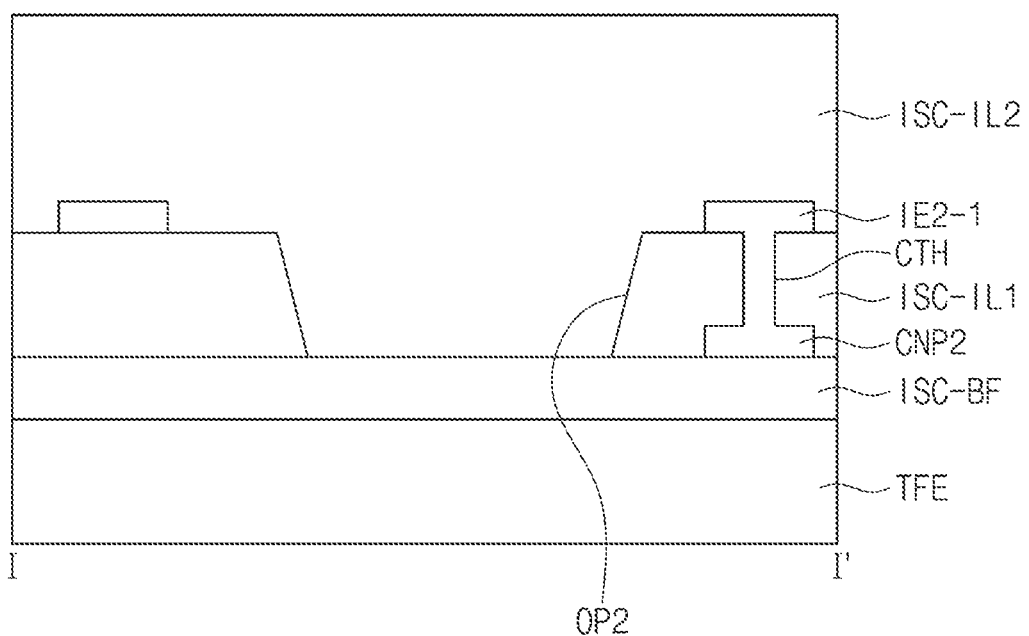
FIG. 10 is a cross section taken along the line of FIG. 8.

FIG. 10 is a cross section taken along the line I-I' of FIG. 8.

A second opening part OP2 corresponding to the pixel area may be defined in the first insulation layer ISC-IL1. Referring to FIG. 5 and FIG. 10, the second opening part OP2 of the first insulation layer ISC-IL1 may overlap with the first opening part OP1 of the pixel defining layer PDL.

Figure 11:
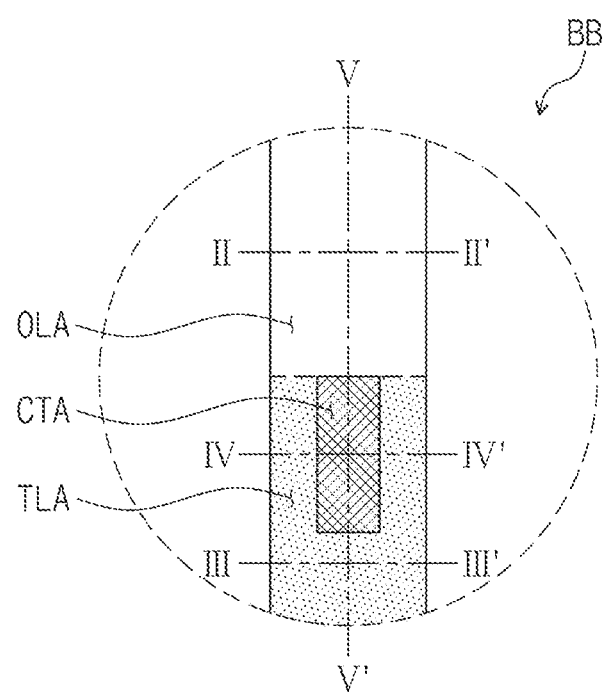
FIG. 11 is an enlarged view of area BB in FIG. 7.
Figure 12C:
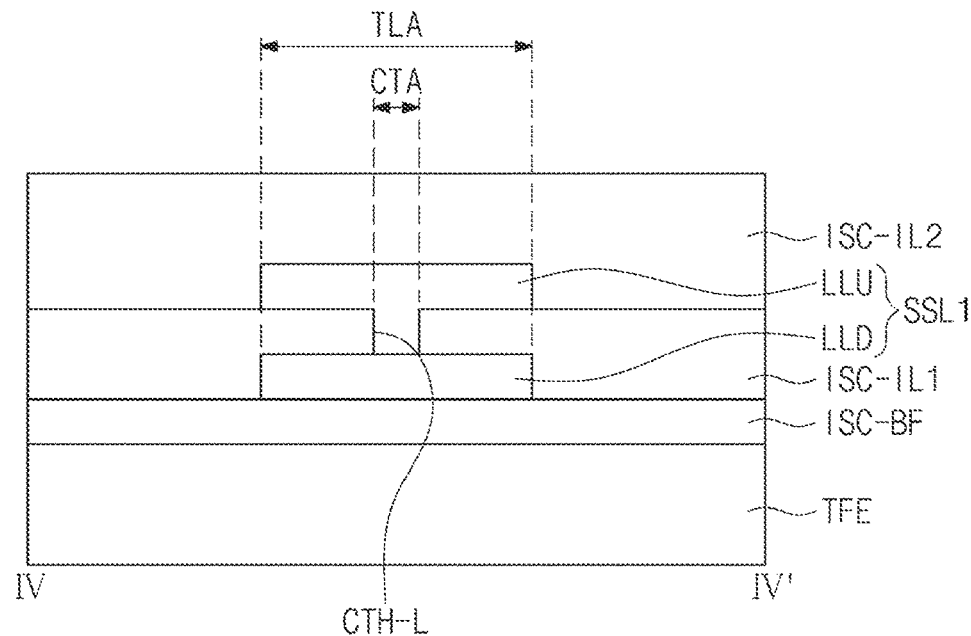
FIG. 12C is a cross section taken along the line IV-IV' of FIG. 11 by way of example.
Figure 12D:
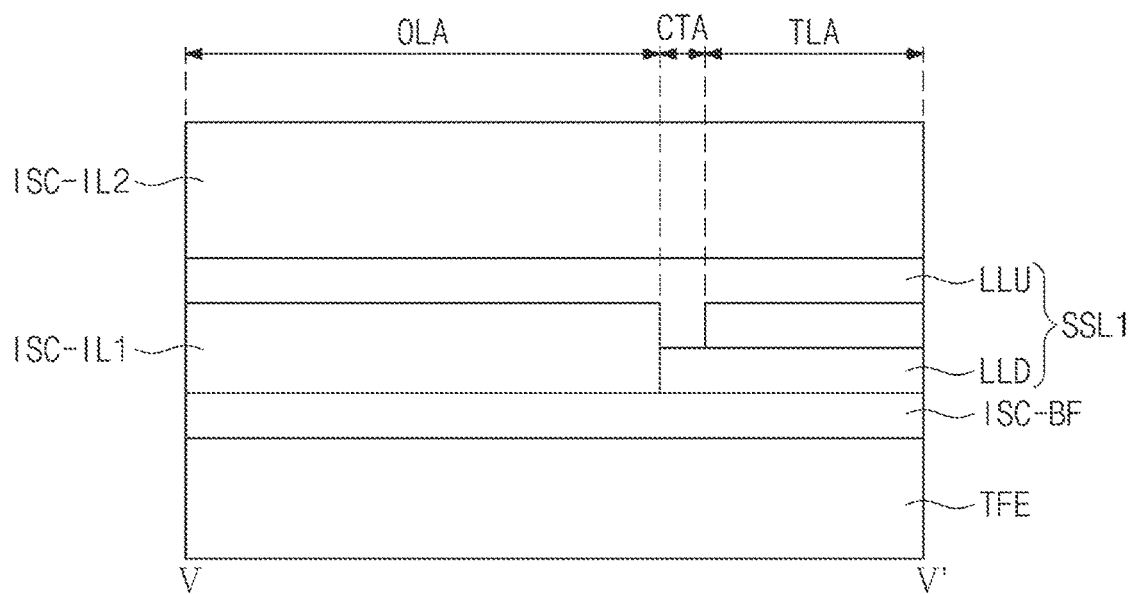
FIG. 12D is a cross section taken along the line V-V' of FIG. 11 by way of example.

FIG. 11 is an enlarged view of area BB in FIG. 7. FIG. 12A is a cross section taken along the line II-II' of FIG. 11 by way of example. FIG. 12B is a cross section taken along the line III-III' of FIG. 11 by way of example. FIG. 12C is a cross section taken along the line IV-IV' of FIG. 11 by way of example. FIG. 12D is a cross section taken along the line V-V' of FIG. 11 by way of example.

Each of the first signal lines SSL1 and the second signal lines SSL2 may be divided into a single-layer area OLA and a multi-layer area TLA. The multi-layer area TLA may include a contact area CTA.

Each of the first signal lines SSL1 and the second signal lines SSL2 may include a lower line LLD and an upper line LLU. The lower line LLD and the upper line LLU overlap each other.

Referring to FIG. 12A, the single-layer area OLA is an area in which only the upper line LLU is disposed. Referring to FIG. 12B, the multi-layer area TLA is an area in which the upper line LLU and the lower line LLD are disposed. Referring to FIG. 12C, the contact area CTA is an area in which the upper line LLU and the lower line LLD are electrically connected through a contact hole CTH-L.

Referring to FIG. 7, the upper line LLU contacts the first sensor IE1, but the lower line LLD does not contact the second sensor IE2. The lower line LLD is in electrical contact with the upper line LLU and serves to lower the resistance of each of the signal lines SSL1 and SSL2.

Referring to FIGS. 7 and 12A to 12D, the first signal line SSL1 disposed outside (farthest from the sensor area SA) among the first signal lines SSL1 is longer than the first signal line SSL1 disposed inside (closest to the sensor area SA). The first signal line SSL1 disposed inside may be located between the first signal line SSL1 disposed outside and the sensor area SA. For example, at least a portion of the lower line LLD of the first signal line SSL1 disposed inside may be located between the lower line LLD of the first signal line SSL1 disposed outside and the second connection pattern CNP2 (see FIG. 9A), and at least a portion of the upper line LLU of the first signal line SSL1 disposed inside may be located between the upper line LLU of the first signal line SSL1 disposed outside and the first sensor IE1. Therefore, the length (hereinafter referred to as a first length) of a lower line LLD (hereinafter referred to as a first lower line) disposed outside among the lower lines LLD is longer than the length (hereinafter referred to as a second length) of a lower line LLD (hereinafter referred to as a second lower line) disposed inside. The length (hereinafter referred to as a third length) of an upper line LLU (hereinafter referred to as a first upper line) disposed outside among the upper lines LLU is longer than the length (hereinafter referred to as a fourth length) of an upper line LLU (hereinafter referred to as a second upper line) disposed inside.

The upper line LLU is longer than the corresponding lower line LLD. Thus, the third length is greater than the first length, and the fourth length is greater than the second length.

The number of contact areas CTA (or first contact areas) of the first signal line SSL1 of the long length is greater than the number of contact areas CTA (or second contact areas) of the first signal line SSL1 of the short length.

That is, the number of the contact holes CTH-L (or first contact holes) defined between the lower line LLD and the upper line LLU of the first signal line SSL1 of the long length is greater than the number of contact holes CTH-L (or second contact holes) defined between the lower line LLD and the upper line LLU of the first signal line SSL1 of the short length.

Since the number of first contact areas CTA is greater than the number of second contact areas CTA, the first signal line SSL1 having a long length may be further reduced in resistance value by the lower line LLD than the first signal line SSL1 having a short length. That is, the first signal lines SSL1 having a larger number of contact areas CTA among the first signal lines SSL1 may be further reduced in resistance value by the lower line LLD as compared to the first signal lines SSL1 having a small number of contact areas CTA. Accordingly, the first signal lines SSL1 having different lengths may have mutually uniform (or substantially uniform) resistance values.

In one or more embodiments of the inventive concept, the difference between the third length and the first length may be less than the difference between the fourth length and the second length. That is, the length of the single-layer area OLA of the first signal line SSL1 having a long length may be shorter than the length of the single-layer area OLA of the first signal line SSL1 having a short length. As the single-layer area OLA becomes larger in the first signal line SSL1, the resistance value becomes larger. Thus, when the single-layer area OLA in the first signal line SSL1 having a shorter length is increased, the first signal lines SSL1 having different lengths may have a uniform (or a substantially uniform) resistance value with respect to each other.

Referring to FIGS. 7 and 12C, one end of the lower line LLD may be exposed by the contact hole CTH-L and electrically connected to the upper line LLU.

The contact hole CTH-L, which exposes one end of the lower line LLD, may be a contact hole CTH-L spaced farthest from the first signal pad PD-S1 electrically connected to the exposed lower line LLD among the plurality of contact holes CTH-L. Therefore, the length of the lower line LLD increases so that the resistance value of each of the signal lines SSL1 and SSL2 may be prevented or blocked from increasing unnecessarily.

Although the first signal lines SSL1 are mainly described above, the descriptions of the lower line LLD and the upper line LLU of each of the second signal lines SSL2 are substantially identical to those provided in connection with the first signal lines SSL1.

Figure 13:
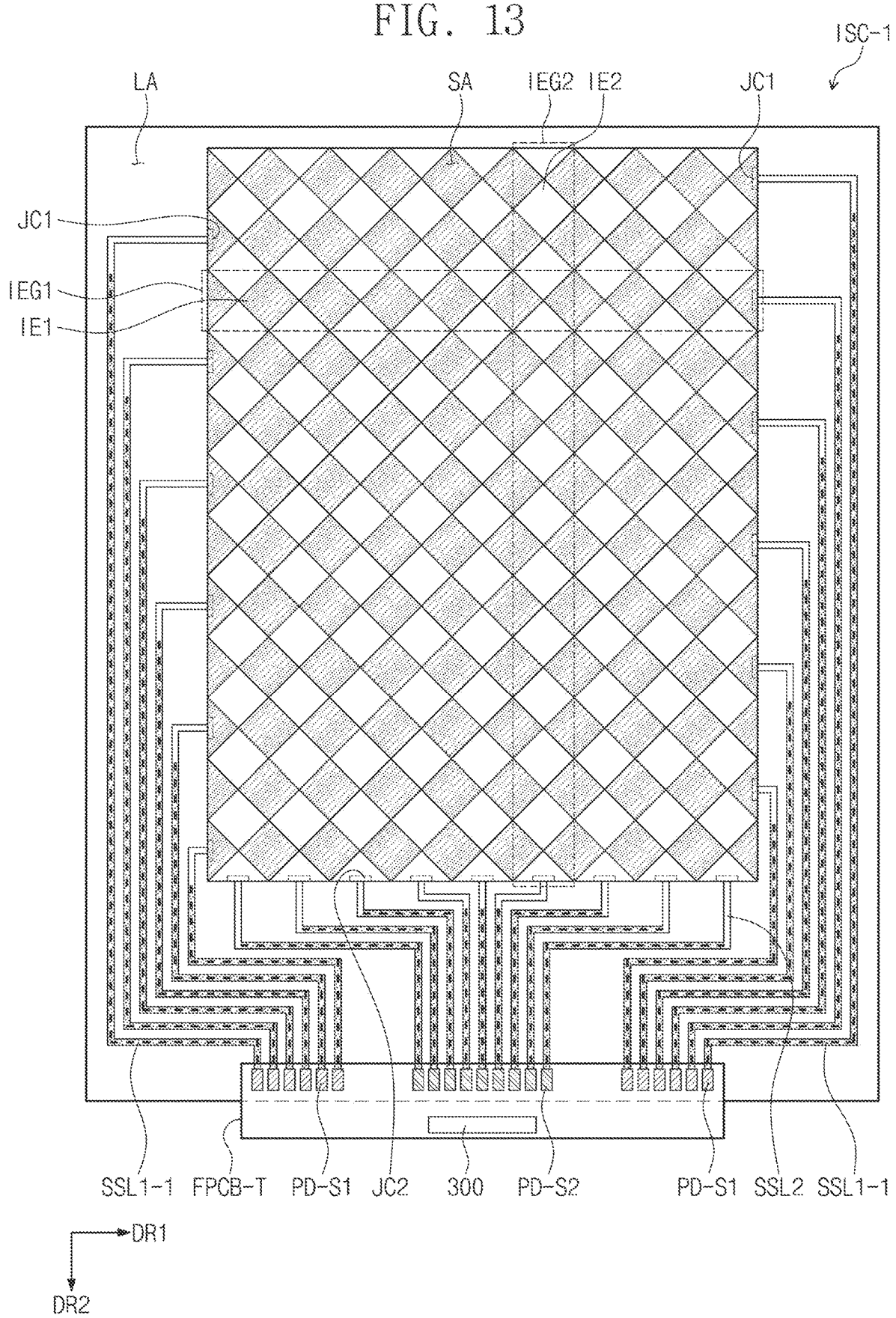
FIG. 13 is a plan view of an input sensing circuit according to an embodiment of the inventive concept.

FIG. 13 is a plan view of an input sensing circuit ISC-1 according to one or more embodiments of the inventive concept.

The first signal lines SSL1-1 shown in FIG. 13 are arranged alternately to the left and right of the sensor area SA, unlike the first signal lines SSL1 shown in FIG. 7.

More specifically, the odd-numbered first signal lines SSL1-1 among the first signal lines SSL1-1 may be arranged on the right side of the sensor area SA, and the even-numbered first signal lines SSL1-1 may be arranged on the left side of the sensor area SA.

Accordingly, the odd-numbered first signal lines SSL1-1 may be electrically connected to the odd-numbered first sensor groups IEG1, and the even-numbered first signal lines SSL1-1 may be electrically connected to the even-numbered first sensor groups IEG1.

Figure 14:
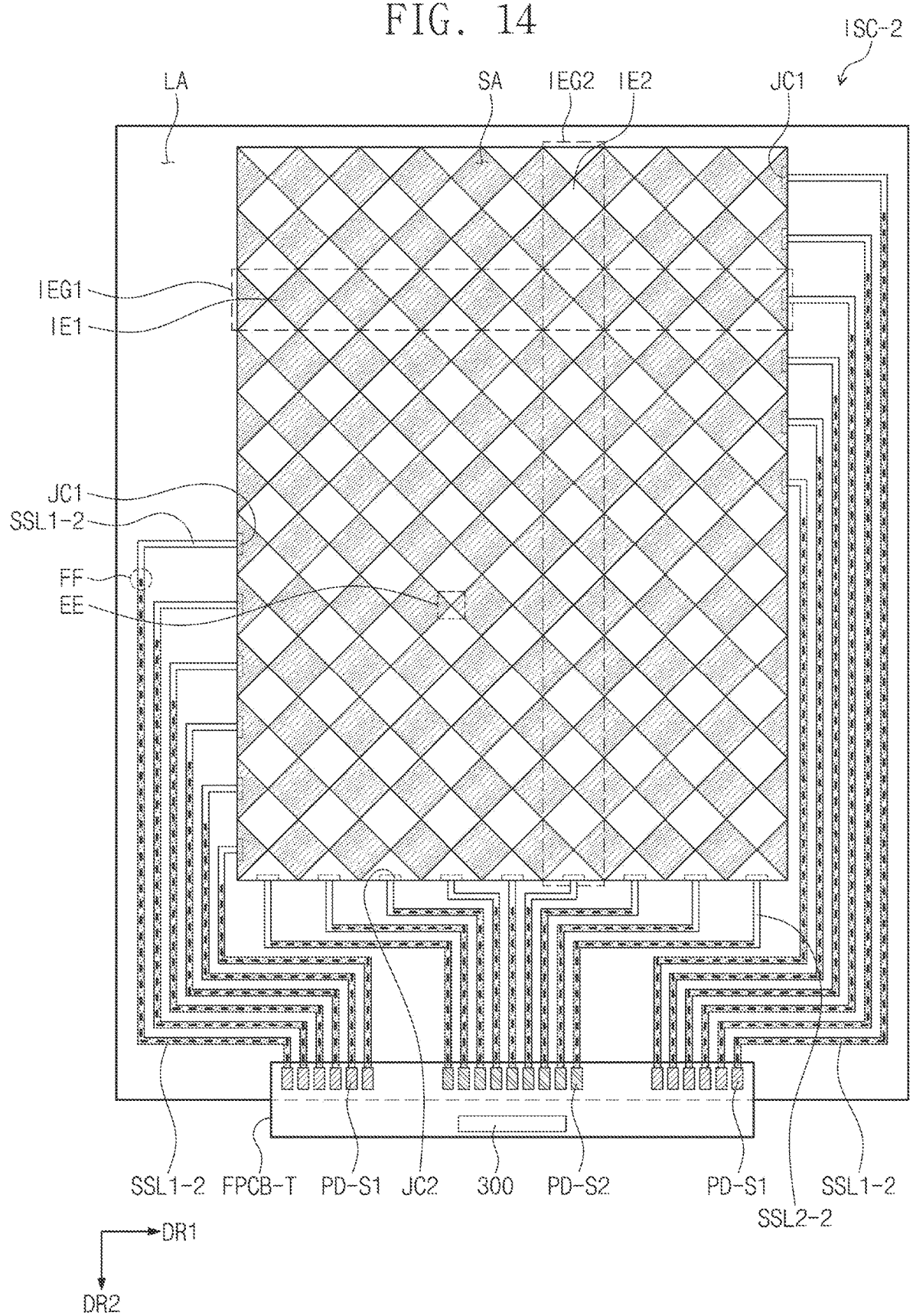
FIG. 14 is a plan view of an input sensing circuit according to an embodiment of the inventive concept.
Figure 15:
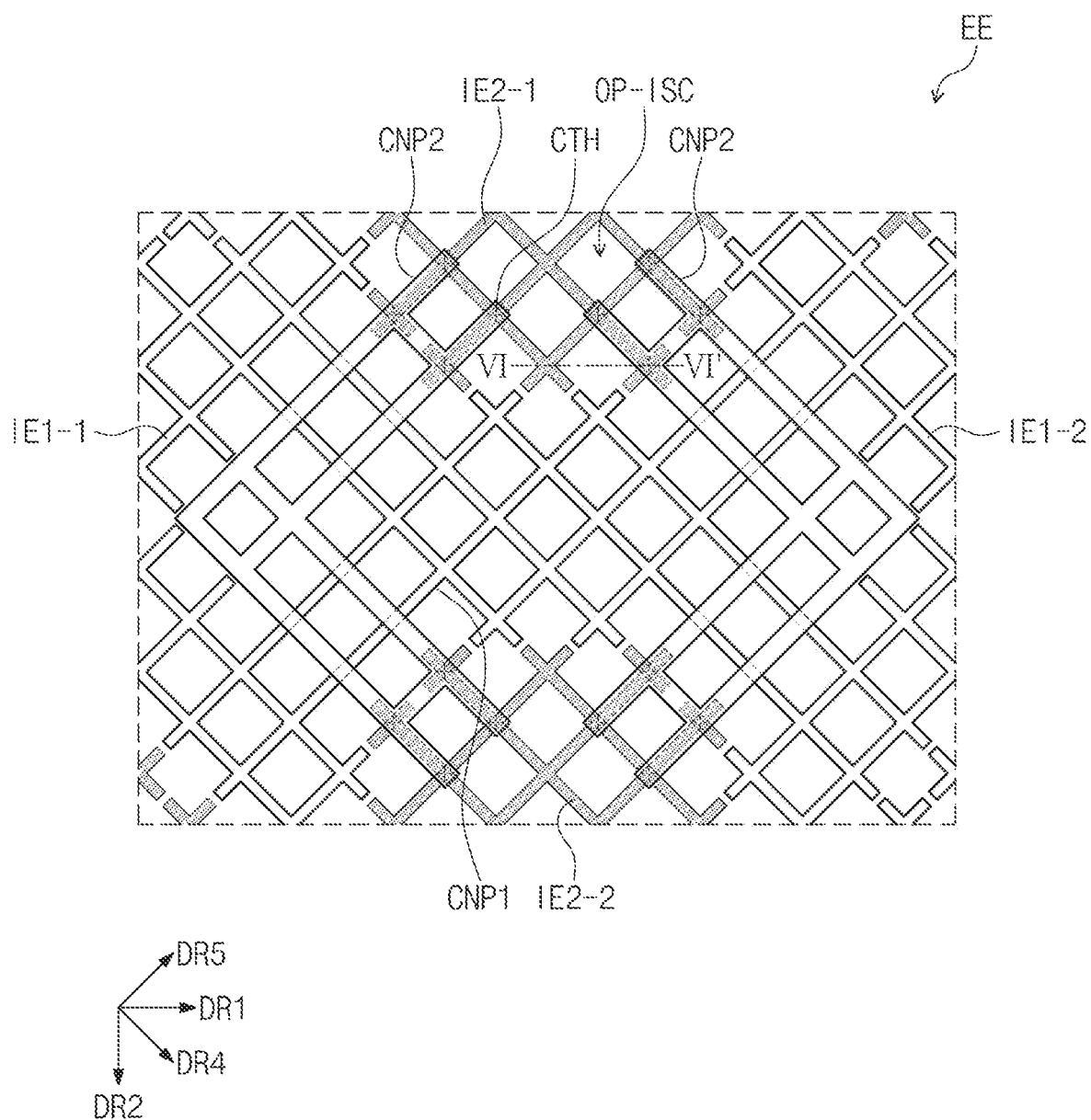
FIG. 15 is an enlarged view of area EE in FIG. 14.
Figure 16:
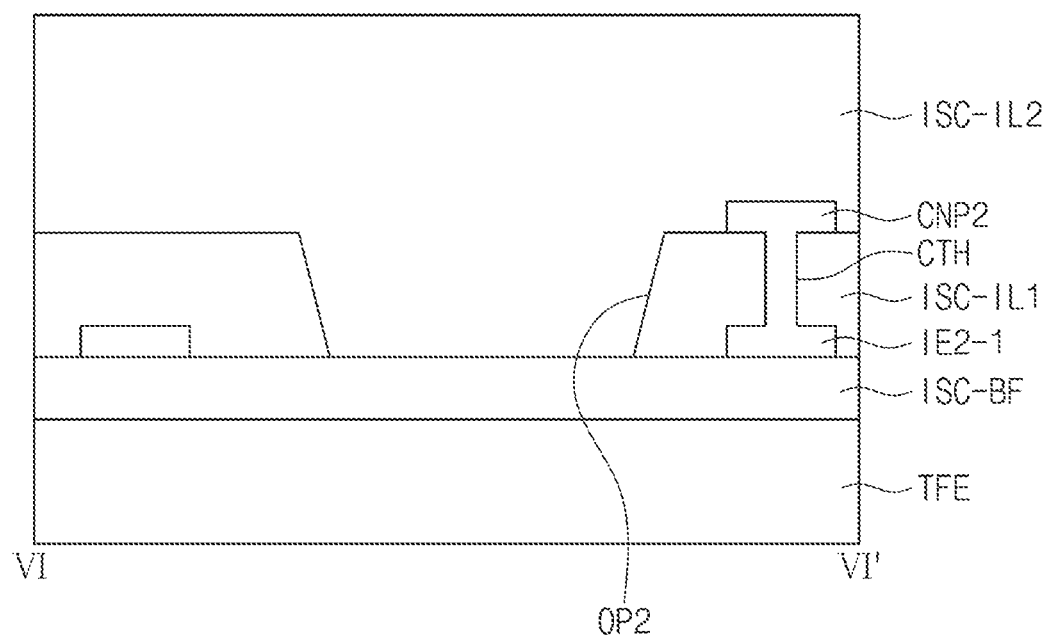
FIG. 16 is a cross section taken along the line VI-VI' of FIG. 15.

FIG. 14 is a plan view of an input sensing circuit ISC-2 according to one or more embodiments of the inventive concept. FIG. 15 is an enlarged view of area EE in FIG. 14. FIG. 16 is a cross section taken along the line VI-VI' of FIG. 15.

Referring to FIGS. 14, 15 and 16, unlike the input sensing circuit ISC shown in FIG. 7, in the input sensing circuit ISC-2, the second connection pattern CNP2 may be arranged in the upper layer than (e.g., relative to) the first connection pattern CNP1 and the sensors IE1-1, IE1-2, IE2-1 and IE2-2.

Figure 17:
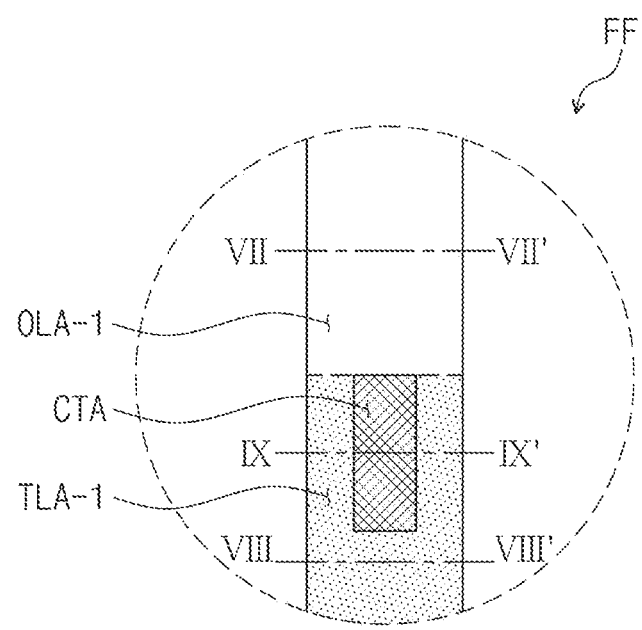
FIG. 17 is an enlarged view of area FF in FIG. 14.
Figure 18A:
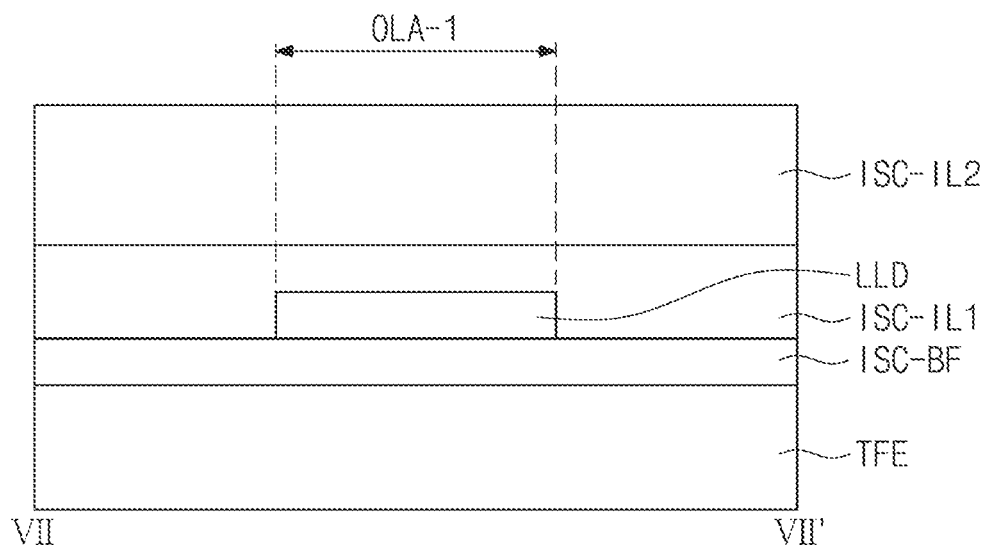
FIG. 18A is a cross section taken along the line VII-VII' of FIG. 17 by way of example.
Figure 18B:
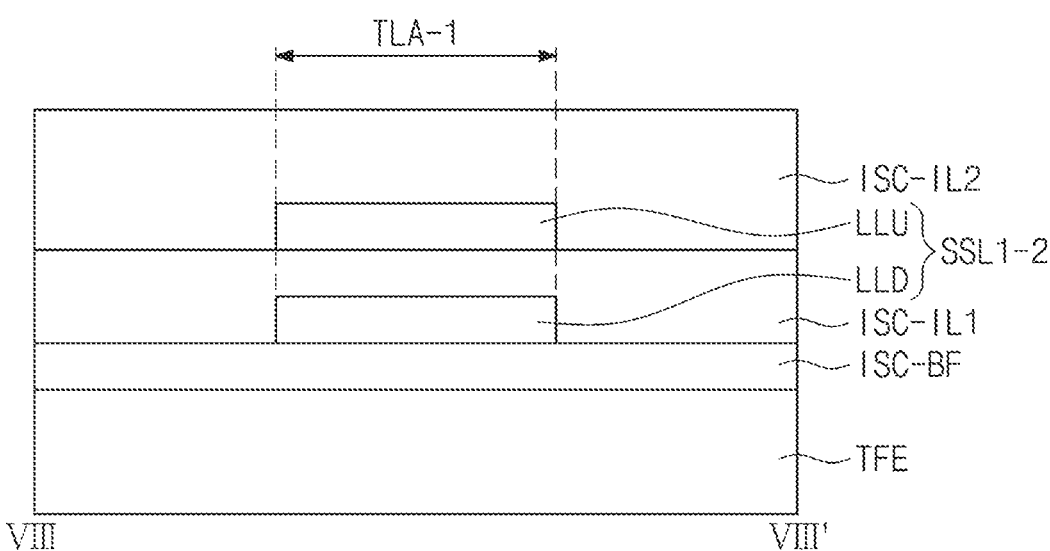
FIG. 18B is a cross section taken along the line VIII-VIII' of FIG. 17 by way of example.
Figure 18C:
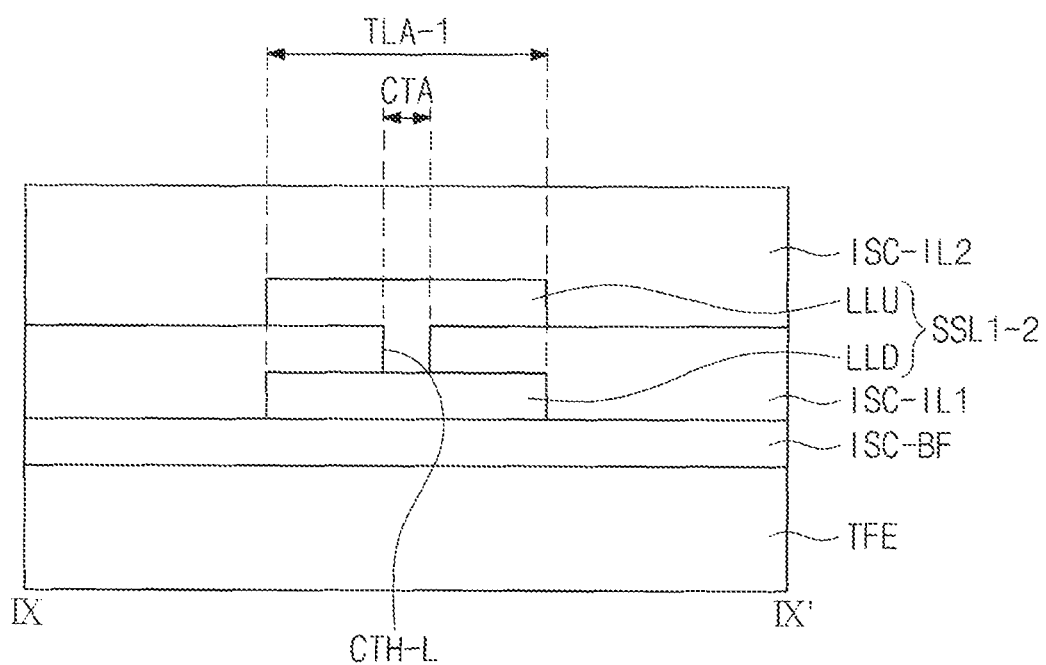
FIG. 18C is a cross section taken along the line IX-IX' of FIG. 17 by way of example.

FIG. 17 is an enlarged view of area FF in FIG. 14. FIG. 18A is a cross section taken along the line VII-VII' of FIG. 17 by way of example. FIG. 18B is a cross section taken along the line VIII-VIII' of FIG. 17 by way of example. FIG. 18C is a cross section taken along the line IX-IX' of FIG. 17 by way of example.

Referring to FIGS. 17 to 18C, unlike the input sensing circuit ISC shown in FIG. 7, in the input sensing circuit ISC-2, only the lower line LLD may be disposed in the single-layer area OLA-1 of the first signal line SSL1-2 and the second signal line SSL2-2, and both the upper line LLU and the lower line LLD may be disposed in the multi-layer area TLA-1.

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

According to one or more embodiments of the inventive concept, the signal lines constituting the input sensing circuit may have mutually uniform (or substantially uniform) resistance values. Accordingly, an input sensing circuit having excellent (or suitable) touch sensitivity and a display device including the same may be provided.

Although the example embodiments of the inventive concept have been described, it is understood that the inventive concept should not be limited to these example embodiments but various changes and modifications may be made by one ordinary skilled in the art within the spirit and scope of the inventive concept as hereinafter claimed by the following claims and their equivalents.

What is claimed is:

1. A display device comprising:
    first sensor electrodes arranged along a first direction;
    second sensor electrodes arranged along a second direction crossing the first direction and crossing the first sensor electrodes;
    first lines electrically connected to the first sensor electrodes, respectively; and
    second lines electrically connected to the second sensor electrodes, respectively,
    wherein the first sensor electrodes are divided into first group sensor electrodes and second group sensor electrodes spaced from the first group sensor electrodes in the first direction,
    wherein the first lines comprise first group lines and second group lines spaced in the second direction with the second sensor electrodes interposed therebetween,
    wherein the first group lines are electrically connected to the first group sensor electrodes, respectively,
    wherein the second group lines are electrically connected to the second group sensor electrodes, respectively,
    wherein each of the first and second group lines comprises a first layer line and a second layer line located on the first layer line and electrically connected to the first layer line, a length of the first layer line being shorter than a length of the second layer line,
    wherein the first lines comprise a 1-1st line and a 1-2nd line shorter than the 1-1st line,
    wherein a length of the first layer line of the 1-1st line and a length of the first layer line of the 1-2nd line are different, and
    wherein a first difference between lengths of the first layer line of the 1-1st line and the second layer line of the 1-1st line and a second difference between lengths of the first layer line of the 1-2nd line and the second layer line of the 1-2nd line are different.

2. The display device of claim 1, further comprising pads electrically connected to the first lines and the second lines, respectively, wherein the pads are spaced from the first sensor electrodes and the second sensor electrodes in the first direction.

3. The display device of claim 2, wherein the second group sensor electrodes are located between the first group sensor electrodes and the pads.

4. The display device of claim 1, further comprising an insulating layer located between the first layer line and the second layer line, wherein a plurality of contact holes are defined in the insulating layer, and the first layer line and the second layer line are electrically connected through the plurality of contact holes.

5. The display device of claim 4,
    wherein the first layer line of the 1-1st line and the second layer line of the 1-1st line are electrically connected through a plurality of X contact holes,
    wherein the first layer line of the 1-2nd line and the second layer line of the 1-2nd line are electrically connected through a plurality of Y contact holes, and
    wherein X is greater than Y.

6. The display device of claim 1, wherein the first difference is less than the second difference.

7. The display device of claim 1, wherein each of the first sensor electrodes comprises a first edge and a second edge spaced from each other in the second direction,
    wherein the first group lines are respectively connected to first edges of the first group sensor electrodes, and
    wherein the second group lines are respectively connected to second edges of the second group sensor electrodes.

8. The display device of claim 1, wherein the second layer line comprises a first portion that does not overlap the first layer line and a second portion that overlaps the first layer line, and
    wherein the first portion is in contact with a corresponding one of the first sensor electrodes.

9. The display device of claim 1, wherein a length of a shortest first group line among the first group lines is longer than a length of a longest second group line among the second group lines.

10. The display device of claim 1, wherein the second lines are located between the first group lines and the second group lines.

11. The display device of claim 1, wherein each of the second lines comprises a third layer line at a same layer as the first layer line and a fourth layer line at a same layer as the second layer line.

12. A display device comprising:
    first sensor electrodes arranged along a first direction;
    second sensor electrodes arranged along a second direction crossing the first direction and crossing the first sensor electrodes;
    first lines comprising first group lines electrically connected to some first sensor electrodes of the first sensor electrodes, respectively, and second group lines electrically connected to remaining first sensor electrodes of the first sensor electrodes, respectively; and
    second lines electrically connected to the second sensor electrodes, respectively,
    wherein a length of a shortest first group line among the first group lines is longer than a length of a longest second group line among the second group lines,
    wherein each of the first group lines and the second group lines comprises a first layer line and a second layer line located on the first layer line and electrically connected to the first layer line, a length of the first layer line being shorter than a length of the second layer line,
    wherein the first lines comprise a 1-1st line and a 1-2nd line shorter than the 1-1st line,
    wherein a length of the first layer line of the 1-1st line and a length of the first layer line of the 1-2nd line are different, and
    wherein a first difference between lengths of the first layer line of the 1-1st line and the second layer line of the 1-1st line and a second difference between lengths of the first layer line of the 1-2nd line and the second layer line of the 1-2nd line are different.

13. The display device of claim 12, wherein the second lines are located between the first group lines and the second group lines.

14. The display device of claim 12, further comprising an insulating layer located between the first layer line and the second layer line, wherein a plurality of contact holes are defined in the insulating layer, and the first layer line and the second layer line are electrically connected through the plurality of contact holes.

15. The display device of claim 14,
    wherein the first layer line of the 1-1st line and the second layer line of the 1-1st line are electrically connected through a plurality of X contact holes,
    wherein the first layer line of the 1-2nd line and the second layer line of the 1-2nd line are electrically connected through a plurality of Y contact holes, and
    wherein X is greater than Y.

16. The display device of claim 12, wherein the first difference is less than the second difference.

17. The display device of claim 12, wherein a number of the first lines is greater than a number of the second lines.

\* \* \* \* \*